(12) United States Patent
Matsushita et al.

(10) Patent No.: US 8,749,224 B2
(45) Date of Patent: Jun. 10, 2014

(54) VOLTAGE DETECTION CIRCUIT AND METHOD FOR CONTROLLING THE SAME

(75) Inventors: Rumi Matsushita, Kanagawa (JP); Shinichi Nakatsu, Kanagawa (JP); Kuniyasu Ishihara, Kanagawa (JP); Kimiharu Eto, Kanagawa (JP); Seiya Indo, Kanagawa (JP); Hirotaka Shimoda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 331 days.

(21) Appl. No.: 13/188,100

(22) Filed: Jul. 21, 2011

(65) Prior Publication Data

US 2012/0025805 A1 Feb. 2, 2012

(30) Foreign Application Priority Data

Jul. 30, 2010 (JP) ................................ 2010-171389

(51) Int. Cl.
*G01R 19/00* (2006.01)
(52) U.S. Cl.
USPC ...................................................... 324/76.11
(58) Field of Classification Search
None
See application file for complete search history.

(56) References Cited

U.S. PATENT DOCUMENTS

| | | | | |
|---|---|---|---|---|
| 4,271,505 A | * | 6/1981 | Menot et al. | 370/400 |
| 5,274,785 A | * | 12/1993 | Kuddes et al. | 710/111 |
| 5,631,537 A | * | 5/1997 | Armstrong | 320/118 |
| 2004/0073388 A1 | * | 4/2004 | Dorny et al. | 702/63 |
| 2010/0088503 A1 | * | 4/2010 | Eto | 713/100 |

FOREIGN PATENT DOCUMENTS

| | | |
|---|---|---|
| JP | 4-76464 A | 3/1992 |
| JP | 11-183532 A | 7/1999 |

OTHER PUBLICATIONS

Round-robin scheduling, available at http://en.wikipedia.org/wiki/Round-robin_scheduling.*
R8C/35A Group Hardware Manual, Renesas Microcomputer R8C Family/R8C/3x Series, 208, pp. 19 pages.
R8C/35A Group Hardwar Manual. Renesas Microcomputer R8C Family/R8C/3x Series, Dec. 2008, 807 pages.

* cited by examiner

*Primary Examiner* — Melissa Koval
*Assistant Examiner* — Daniel Miller
(74) *Attorney, Agent, or Firm* — Foley & Lardner LLP

(57) ABSTRACT

A voltage detection circuit including a voltage selection circuit that outputs a voltage commensurate with a power supply voltage as a first voltage; a detection voltage selection circuit that selects either an external input voltage inputted from an external terminal or the first voltage according to a first control signal, and outputs it as a comparison voltage; a reference voltage generation circuit that generates a reference voltage; a comparator that compares the reference voltage and the comparison voltage, and outputs the comparison result as a detection signal; a control circuit that generates the first control signal so that the detection voltage selection circuit may output either the first voltage or the external input voltage as the comparison voltage by time division, and when a variation of the first voltage is detected, generates the first control signal so that the detection object selection circuit may output the first voltage as the comparison voltage.

16 Claims, 20 Drawing Sheets

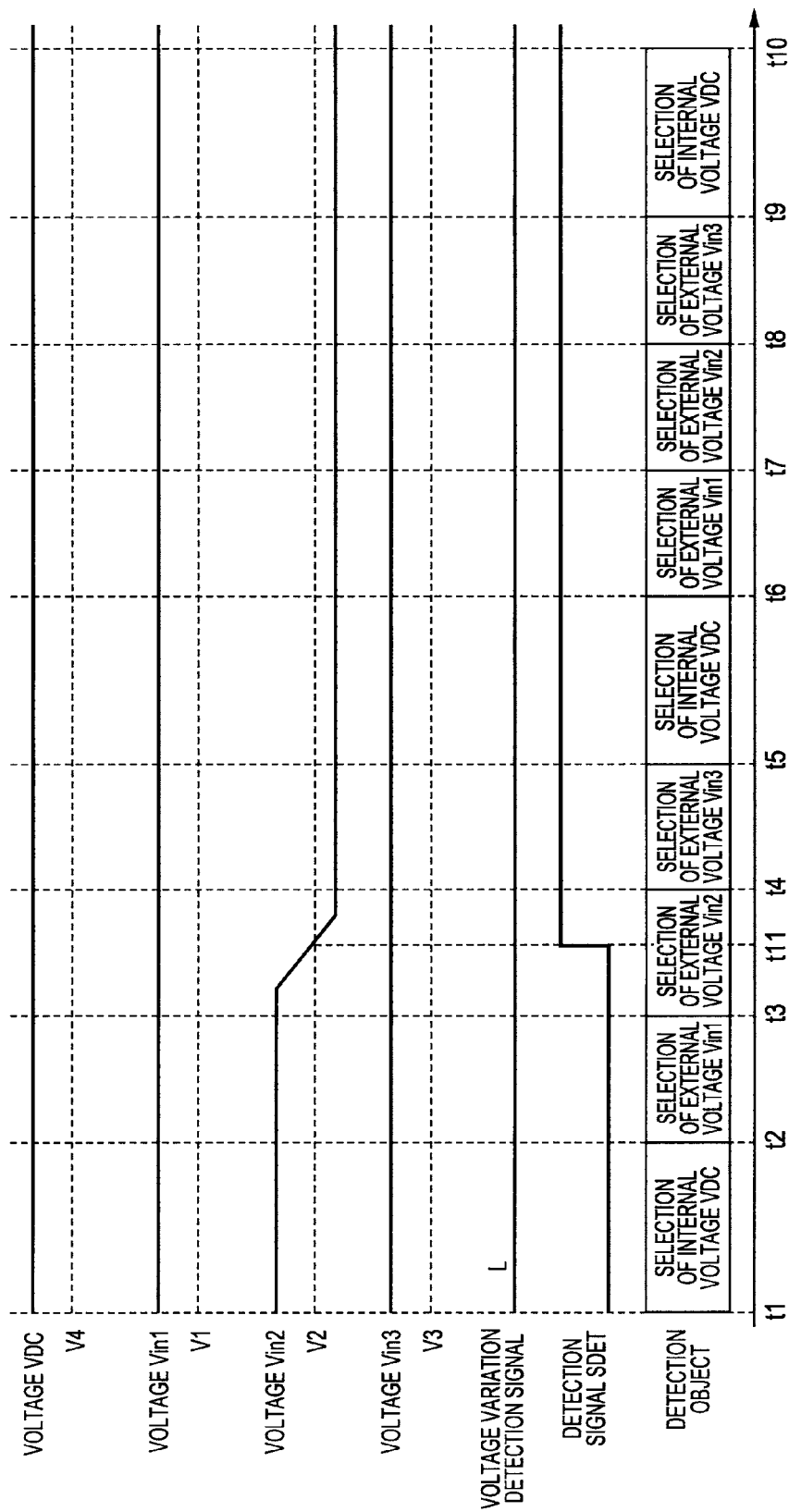

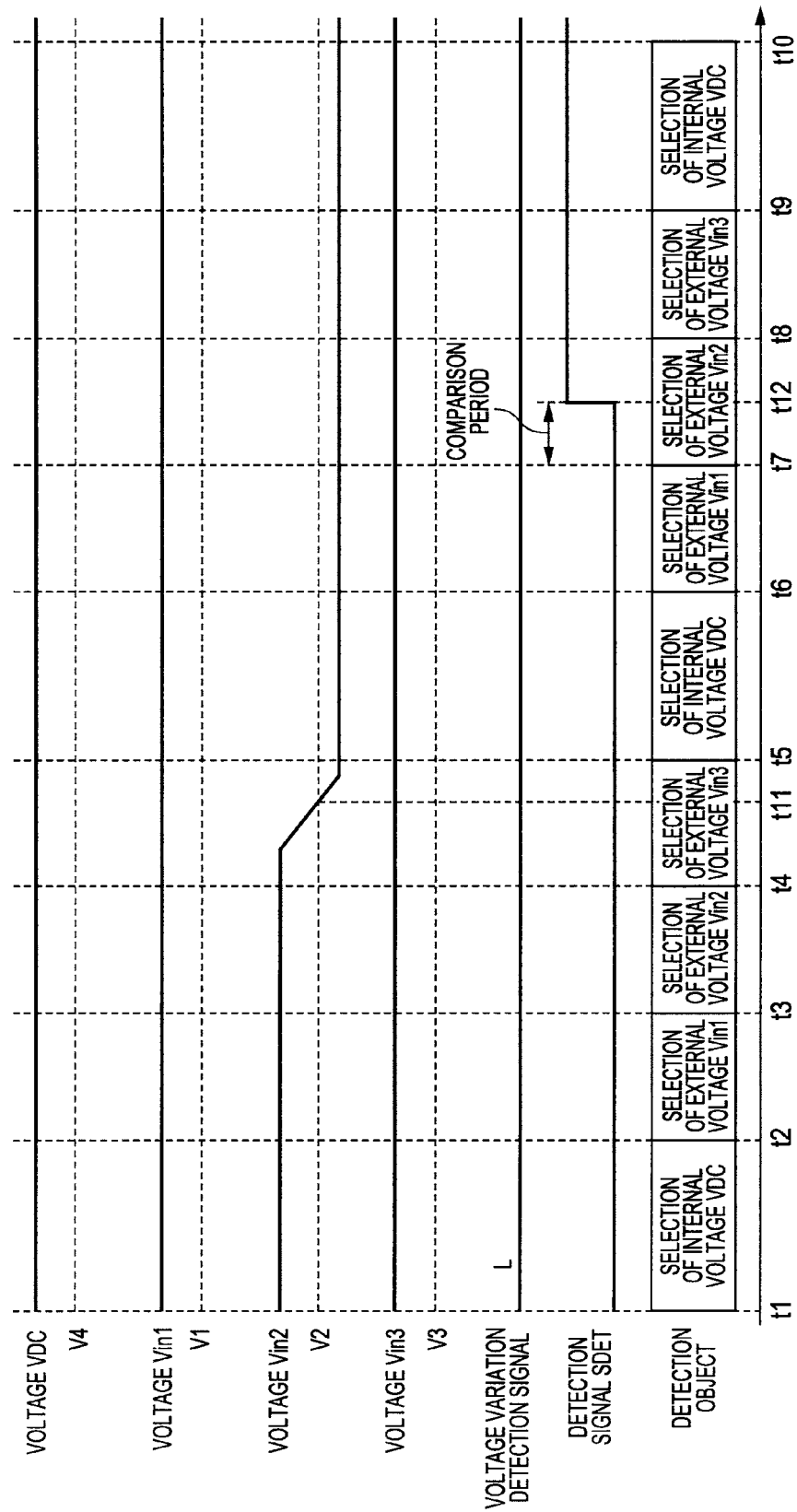

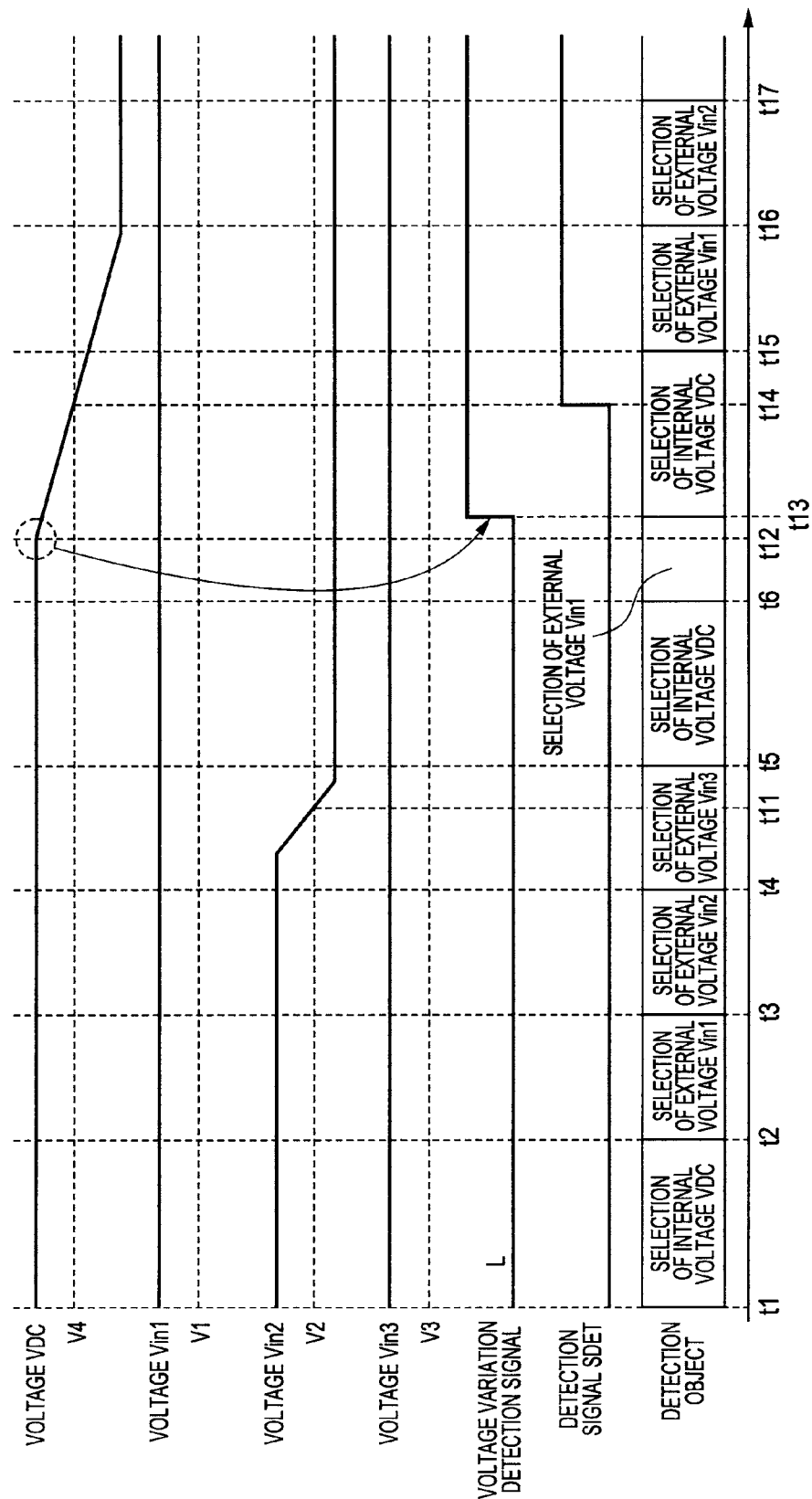

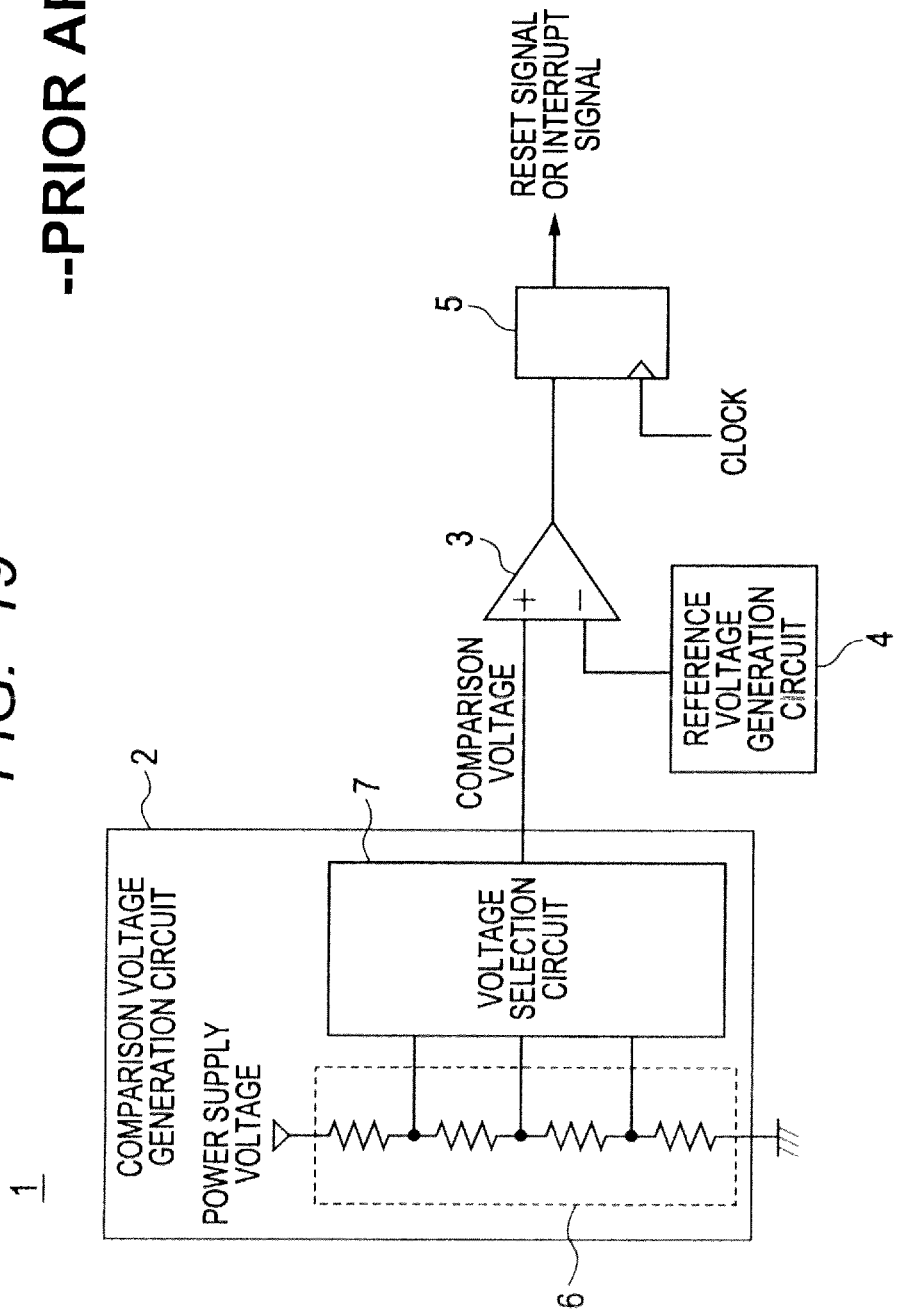
FIG. 19 --PRIOR ART--

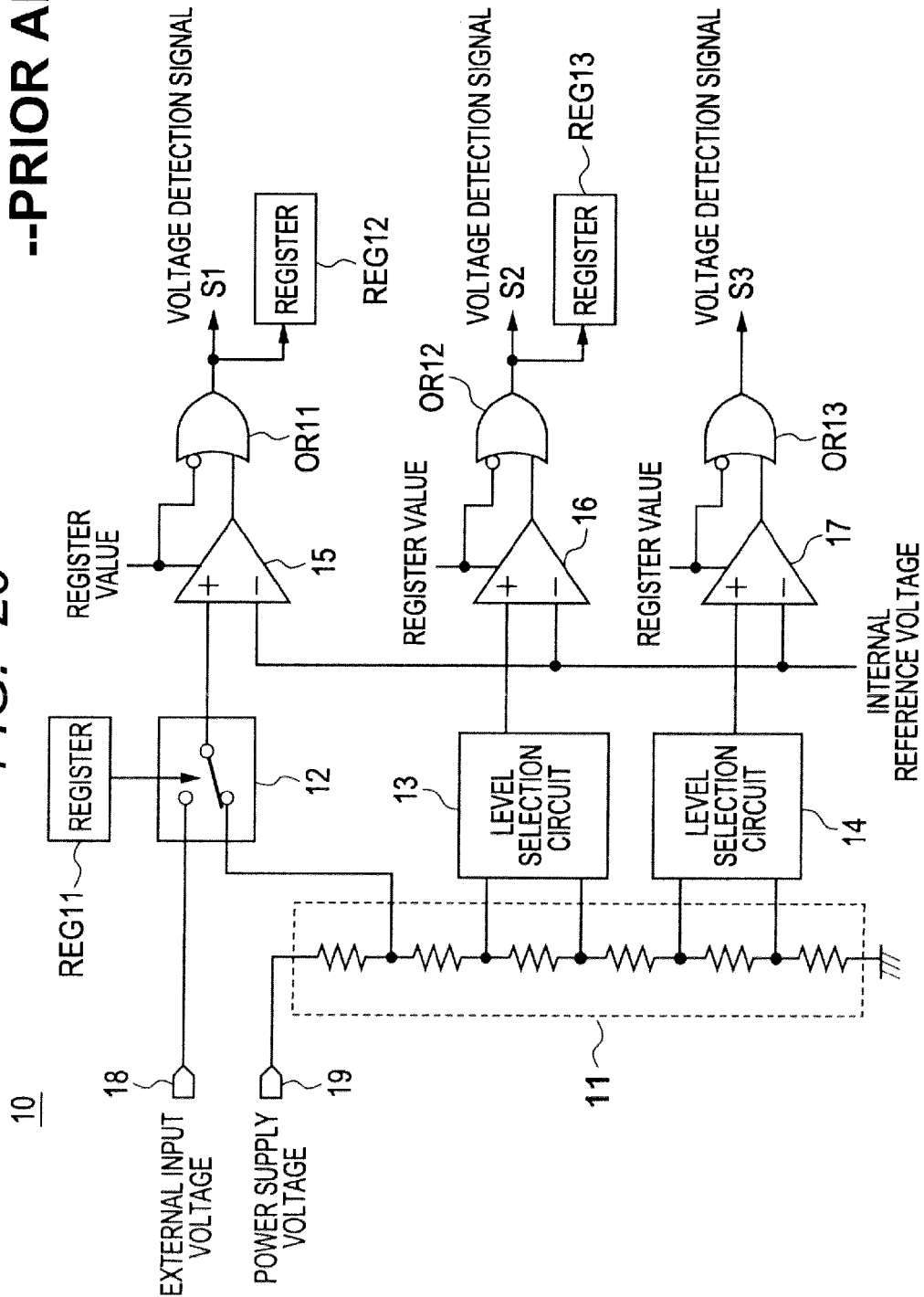
FIG. 20  --PRIOR ART--

VOLTAGE DETECTION CIRCUIT AND METHOD FOR CONTROLLING THE SAME

CROSS-REFERENCE TO RELATED APPLICATIONS

The disclosure of Japanese Patent Application No. 2010-171389 filed on Jul. 30, 2010 including the specification, drawings and abstract is incorporated herein by reference in its entirety.

BACKGROUND

The present invention relates to a voltage detection circuit and a method for controlling the same.

A microcontroller usually has a voltage detection circuit for detecting a voltage drop in order to avoid a malfunction caused by a power supply voltage drop in a system like a mobile apparatus using a battery.

FIG. 19 shows a low voltage detector 1 generally carried on the microcontroller. As shown in FIG. 19, the low voltage detector 1 has a comparison voltage generation circuit 2, a comparator 3, a reference voltage generation circuit 4, and a latch circuit 5.

The comparison voltage generation circuit 2 has a ladder resistor 6 and a voltage selection circuit 7. The ladder resistor 6 has multiple resistors coupled in series between a power supply terminal and a grounding terminal. At nodes among these resistors, multiple voltages obtained by dividing with the resistors can be generated. The voltage selection circuit 7 selects and outputs one of the voltages that the ladder resistor 6 generates. The voltage that the voltage selection circuit 7 selected is designated by a comparison voltage.

The comparator 3 compares a voltage that the reference voltage generation circuit 4 generated and the comparison voltage. Then, the comparator 3 outputs a comparison result as a detection signal. The latch circuit 5 latches the detection signal from the comparator 3 according to a clock, and outputs it as a reset signal or interrupt signal.

The low voltage detector 1 like this detects that the power supply voltage lowers less than a predetermined voltage value. Then, it is capable of preventing the malfunction of a microcontroller that adopts this low voltage detector 1 by outputting the interrupt signal or reset signal. Incidentally, whether the signal to be outputted is the reset signal or interrupt signal is determined according to a configuration of the microcontroller that adopts this low voltage detector 1.

Here, in respect of its capability, the number of sensors that the apparatus has on it, such as a touch sensor and an acceleration sensor, is increasing in recent years. Thus, since multiple sensors are coupled to the microcontroller, multiple comparators for comparing multiple voltages have become necessary. However, the low voltage detector 1 described above can detect only an internal voltage drop of the microcontroller. Therefore, it is incapable of detecting a voltage drop of an external input voltage, such as a sensor output that the microcomputer inputs therein from the outside.

As a system for detecting the voltage drop of the external input voltage inputted from the outside in this way, there is a microcontroller as described in R8C/35A Group Hardware Manual, Renesas Microcomputer R8C Family/R8C/3x Series, pp. 73 to 90. FIG. 20 shows a block configuration diagram of a low voltage detection circuit 10 described in R8C/35A Group Hardware Manual, Renesas Microcomputer R8C Family/R8C/3x Series, pp. 73 to 90.

As shown in FIG. 20, the low voltage detection circuit 10 has a ladder resistor 11, a switch circuit 12, level selection circuits 13, 14, comparators 15 to 17, an external voltage input terminal 18, a power supply terminal 19, registers REG11 to REG13, and OR circuits OR11 to OR13.

The low voltage detection circuit 10 can compare multiple voltages generated by the ladder resistor and an internal reference voltage. For example, the level selection circuits 13, 14 each select one of the voltages generated by the ladder resistor, and output it to the comparators 16, 17, respectively. The comparators 16, 17 each compare the voltage that these level selection circuits 13, 14 selected and the internal reference voltage, and output the comparison result as voltage detection signals S2, S3, respectively. Incidentally, the value of the voltage detection signal S2 is stored in the register REG13.

On the other hand, the switch circuit 12 selects either the voltage generated by the ladder resistor or the external voltage inputted from the external voltage input terminal 18 and inputs it into a non-inverting input terminal of the comparator 15. That selection is decided depending on a value that a register REG11 retains. That is, the comparator 15 compares either the voltage generated by the ladder resistor or the external input voltage inputted from the external voltage input terminal 18 with the internal reference voltage depending on the value that the register REG11 retains. The comparison result is outputted as a voltage detection signal S1. Incidentally, the value of the voltage detection signal S1 is stored in a register REG12.

Thus, the low voltage detection circuit 10 can switch either the external input voltage or the voltage generated from a power supply voltage as a comparison object of the reference voltage with the switch circuit 12. This enables detection of the drop of the external input voltage other than the power supply voltage that cannot be done by the low voltage detector 1.

SUMMARY

As mentioned above, although a low voltage detection circuit 10 can select a power supply voltage and an external input voltage in a register REG11, it is necessary to decide which one is to be used in advance before performing a voltage detection operation. Therefore, for example, when the external input voltage is selected, a voltage drop of the power supply voltage will not be able to be detected. This state is retained until a value of the register REG11 is rewritten. Therefore, when the power supply voltage lowers during this period, there is a possibility that system malfunction may be generated.

On the other hand, although if the power supply voltage drop is always detected, the above-mentioned problem will be solved, in this case a comparator for always monitoring the power supply voltage drop needs to be prepared, which causes occurrence of a problem that a chip area of the microcontroller increases.

One aspect of the present invention is a voltage detection circuit that has: a comparison voltage selection circuit that selects at least one from multiple divided voltage values of the power supply voltage, and outputs it as a first voltage; a detection object selection circuit that selects either the external input voltage inputted from an external terminal or the first voltage according to a first control signal, and outputs it as a comparison voltage; a reference voltage generation circuit that generates a reference voltage; a comparator that compares the reference voltage and the comparison voltage, and outputs the comparison result as a detection signal; and a control circuit that detects the first voltage, and when a variation is detected from the detection result, generates the first voltage so that the detection object selection circuit may output the first voltage as the comparison voltage.

Another aspect of the present invention is a method for controlling a voltage detection circuit that has a voltage selection circuit that outputs a voltage commensurate with the power supply voltage as the first voltage, a detection voltage selection circuit that selects either the external input voltage inputted from the external terminal or the first voltage and outputs it as the comparison voltage, the reference voltage generation circuit that generates the reference voltage, and the comparator that compares the reference voltage and the comparison voltage and outputs the comparison result as the detection signal. With this control method, the detection voltage selection circuit is made to output either the first voltage or the external input voltage as the comparison voltage by time division, and when a variation of the first voltage is detected, even when the detection object selection circuit is selecting the external input voltage, the detection object selection circuit is made to select the first voltage and to output it as the comparison voltage.

The voltage detection circuit according to the present invention is capable of monitoring the external input voltage and the first voltage commensurate with the power supply voltage by time division. Then, when the variation of the first voltage commensurate with the power supply voltage is detected, even during a period of monitoring the external input voltage, the period can be changed forcedly to a period of monitoring the first voltage. Therefore, in spite of being able to detect the power supply voltage drop without leaking, it becomes possible for the only one comparator to detect both the power supply voltage drop and an external input voltage drop.

According to the voltage detection circuit according to the present invention, it become possible to detect the power supply voltage drop and detect a voltage of the external input voltage without increasing a circuit scale.

BRIEF DESCRIPTION OF THE DRAWINGS

FIG. 16 is a timing chart explaining the operation of the voltage detection circuit according to the second embodiment;

FIG. 17 is a timing chart explaining the operation of the voltage detection circuit according to the second embodiment;

FIG. 18 is a timing chart explaining the operation of the voltage detection circuit according to the second embodiment;

FIG. 19 is a configuration of a voltage detection circuit of the related art; and FIG. 20 is a configuration of a voltage detection circuit of the related art.

DETAILED DESCRIPTION

First Embodiment

Figure 1:
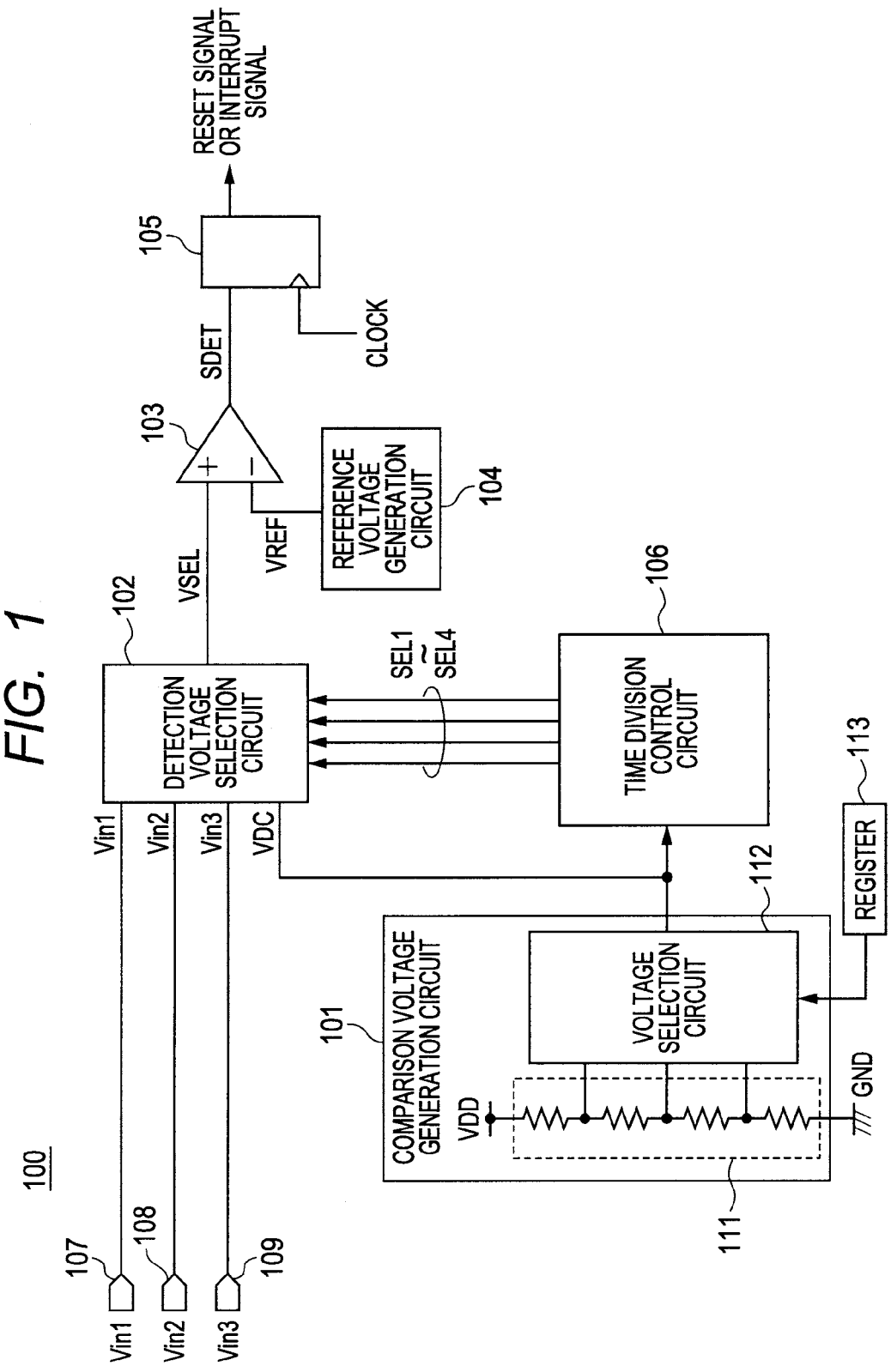
FIG. 1 is a block configuration of a voltage detection circuit according to a first embodiment.

Hereafter, a first concrete embodiment to which the present invention is applied will be explained in detail, referring to drawings. In this first embodiment, the present invention is applied to a voltage detection circuit of a microcontroller. FIG. 1 shows a block configuration of a voltage detection circuit 100 according to the first embodiment. As shown in FIG. 1, the voltage detection circuit 100 has a comparison voltage generation circuit 101, a detection voltage selection circuit 102, a comparator 103, a reference voltage generation circuit 104, a latch circuit 105, a time division control circuit 106, external voltage input terminals 107 to 109, and a register 113.

The comparison voltage generation circuit 101 has a ladder resistor 111 and a voltage selection circuit 112. The ladder resistor 111 has multiple resistors coupled in series between a power supply terminal VDD and a grounding terminal GND. At each coupling node between the resistors, a voltage obtained by dividing a power supply voltage VDD with the resistors is generated.

The voltage selection circuit 112 selects and outputs one of the voltages that the ladder resistor 111 generates. The voltage that this voltage selection circuit 112 selected is designated by an internal voltage VDC. Incidentally, the voltage that the voltage selection circuit 112 selects can be changed by a value stored in the register 113.

The detection voltage selection circuit 102 inputs therein external input voltages Vin1 to Vin3 that the external voltage input terminals 107 to 109 input into them, respectively, and the internal voltage VDC that the voltage selection circuit 112 outputs. Then, according to control signals SEL1 to SEL4, the detection voltage selection circuit 102 selects one from the external input voltages Vin1 to Vin3 and the internal voltage VDC, and outputs it as a selected voltage VSEL.

For example, when a control signal SEL1 is activated, the detection voltage selection circuit 102 outputs the external input voltage Vin1 as the selected voltage VSEL. Similarly, when a control signal SEL2 or SEL3 is activated, the detection voltage selection circuit 102 outputs the external input voltage Vin2 or Vin3 as the selected voltage VSEL, respectively. When a control signal SEL4 is activated, the detection voltage selection circuit 102 outputs the internal voltage VDC as the selected voltage VSEL. Note that, in this first embodiment, it is assumed that the control signals SEL1 to SEL4 shall correspond to the external input voltages Vin1 to Vin3 and the internal voltage VDC, respectively, as described above.

Figure 2:
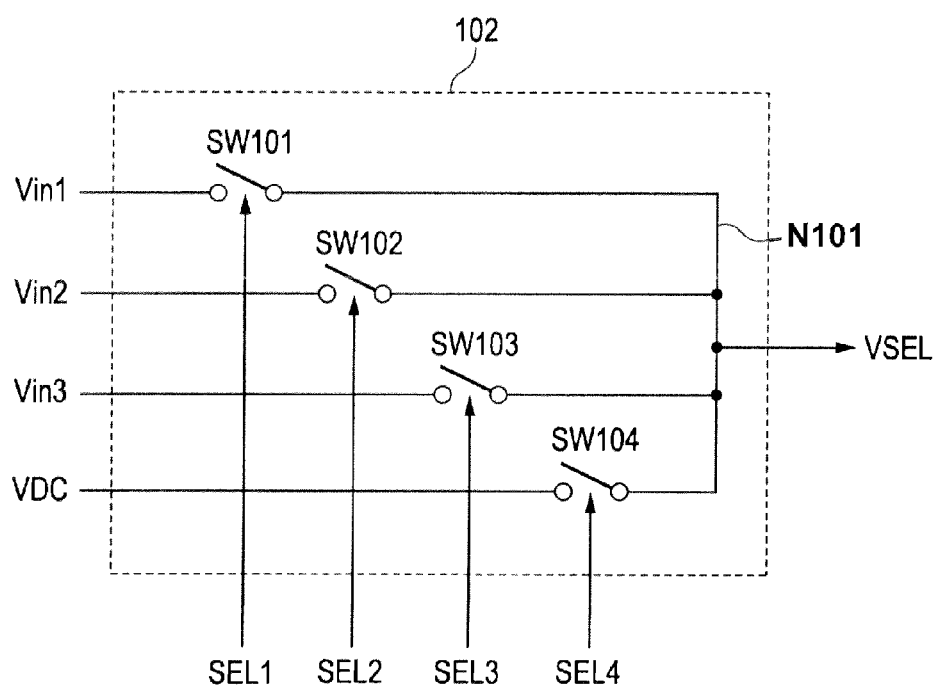
FIG. 2 is a configuration of a detection voltage control circuit according to the first embodiment.

FIG. 2 shows a configuration of the detection voltage selection circuit 102. As shown in FIG. 2, the detection voltage selection circuit 102 has switch circuits SW101 to SW104.

The switch circuit SW101 couples the external voltage input terminal 107 and an output node N101 of the detection voltage selection circuit 102 in response to the activated control signal SEL1. The switch circuit SW102 couples the external voltage input terminal 108 and the output node N101 of the detection voltage selection circuit 102 in response to the activated control signal SEL2. The switch circuit SW103 couples the external voltage input terminal 109 and the output node N101 of the detection voltage selection circuit 102 in response to the activated control signal SEL3. The switch circuit SW104 couples an output of the voltage selection circuit 112 and the output node N101 of the detection voltage selection circuit 102 in response to the activated control signal SEL4.

The reference voltage generation circuit 104 generates a reference voltage VREF of a predetermined value, and outputs it to the comparator 103.

The comparator 103 inputs the selected voltage VSEL into a non-inverting input terminal, and inputs the reference voltage VREF into an inverting input terminal. Then, it compares the selected voltage VSEL and the reference voltage VREF, and outputs the comparison result as a detection signal SDET.

The latch circuit 105 inputs the detection signal SDET into a data input terminal D, and latches the detection signal SDET according to a clock signal. Then, it outputs a value of the latched detection signal SDET as a reset signal or interrupt signal from a data output terminal Q. Incidentally, it is determined according to a configuration of the microcontroller that adopts this voltage detection circuit 100 whether the signal outputted by the latch circuit 105 is the reset signal or interrupt signal.

The time division control circuit 106 controls periods in which the detection voltage selection circuit 102 selects the external input voltage Vin1 to Vin3 and the internal voltage VDC by the control signals SEL1 to SEL4. Therefore, for the selected voltage VSEL that the detection voltage selection circuit 102 outputs, the external input voltages Vin1 to Vin3 and the internal voltage VDC will be time-divided and outputted. Moreover, it inputs therein the internal voltage VDC and monitors the voltage. Incidentally, the control signals SEL1 to SEL4 can be regarded as first control signals.

Figure 3:
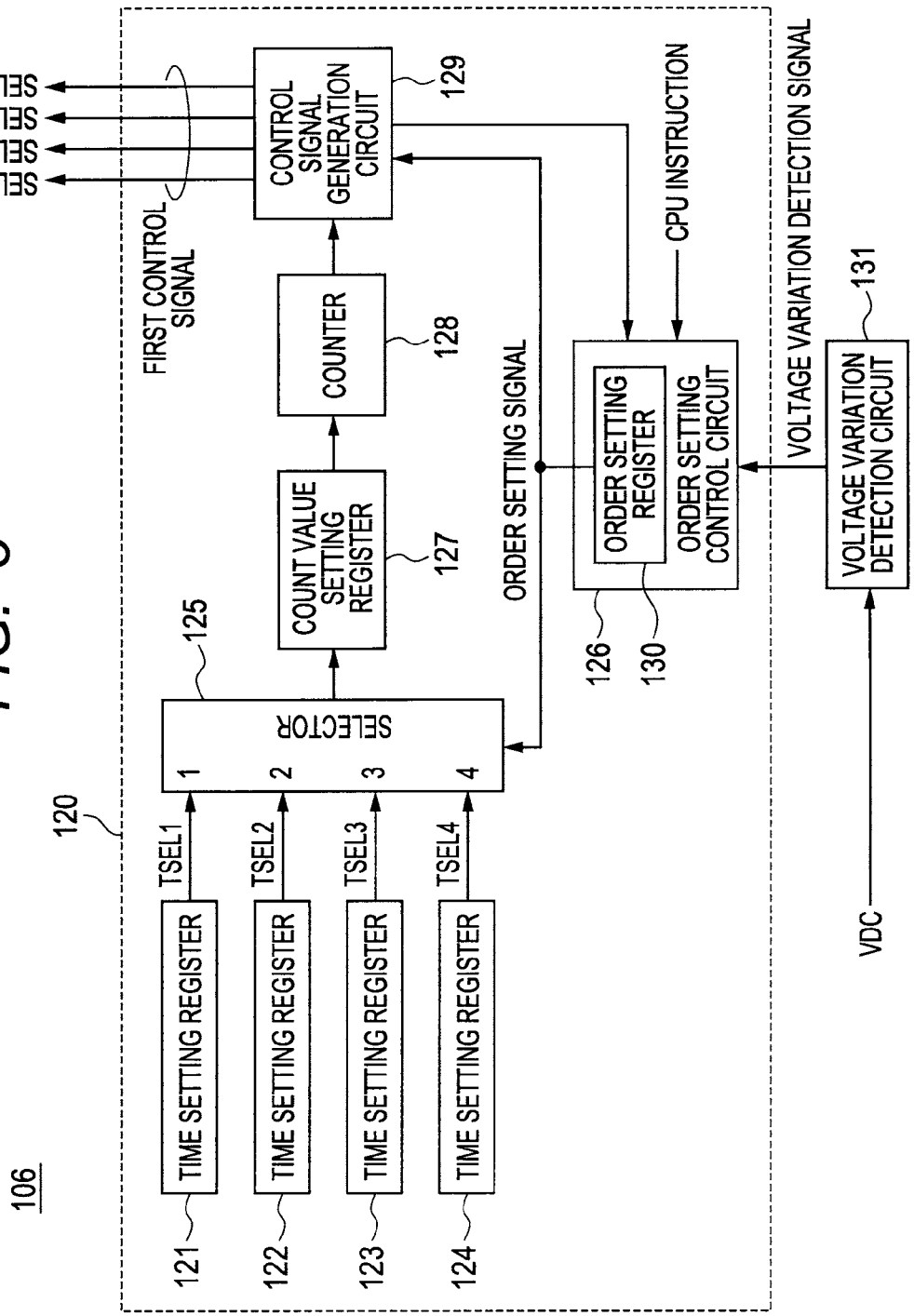
FIG. 3 is a block configuration of a time division control circuit according to the first embodiment.

FIG. 3 shows a configuration of the time division control circuit 106. As shown in FIG. 3, the time division control circuit 106 has a selection signal generation circuit 120 and a voltage variation detection circuit 131.

The selection signal generation circuit 120 has time setting registers 121 to 124, a selector 125, an order setting control circuit 126, a count value setting register 127, a counter 128, and a control signal generation circuit 129. Further, the order setting control circuit 126 has an order setting register 130.

The time setting registers 121 to 124 store values that decide selection periods of the external input voltages Vin1 to Vin3 and the internal voltage VDC each of which the detection voltage selection circuit 102 selects. The register values that these time setting registers 121 to 124 are storing are designated by TSEL1 to TSEL4, respectively.

For example, during a period commensurate with TSEL4 that the time setting register 124 is storing, the detection voltage selection circuit 102 continues to select the internal voltage VDC. Similarly, during periods commensurate with TSEL1 to TSEL3 that the time setting registers 121 to 123 are storing, the detection voltage selection circuit 102 continues to select the external input voltages Vin1 to Vin3, respectively.

The selector 125 selects and outputs one of the register values TSEL1 to TSEL4 according to an order setting signal. For example, when a value of the order setting signal becomes "1," the selector 125 selects and outputs a value of the register value TSEL1. Similarly, when the value of the order setting signal becomes one of "2" to "4," the selector 125 selects and outputs one of the register values TSEL2 to TSEL4, respectively.

The count value setting register 127 stores the value among the register values TSEL1 to TSEL4 that the selector 125 selected and outputted.

The counter 128 performs a count operation during a period commensurate with the value that the count value setting register 127 is storing.

The control signal generation circuit 129 activates and outputs one of the control signals SEL1 to SEL4 according to the order setting signal during a period in which the counter 128 performs the count operation. For example, when the value of the order setting signal becomes "1," it activates the control signal SEL1 during a period of a count operation of the counter 128. Similarly, when the value of the order setting signal becomes "2," "3," and "4," it activates the control signals SEL2, SEL3, and SEL4 during the period of the count operation of the counter 128, respectively.

The order setting register 130 stores a set value for determining the order of the register values TSEL1 to TSEL4 that the selector 125 selects. Then, the value that this order setting register 130 is storing is outputted to the selector 125 as the order setting signal. Therefore, as a result, the selector 125 will select and output any one of TSEL1 to TSEL4 depending on the value that this order setting register 130 stores.

The order setting control circuit 126 controls the value that the order setting register 130 stores. The value that the order setting register 130 stores may be varied sequentially as "4," "1," "2," "3," "4," "1," "2," . . . by the order setting control circuit 126, for example, each time the count operation of the counter 128 is completed. Moreover, it may be configured so that the value that the order setting register 130 stores may be rewritten by an instruction of a CPU of the microcontroller etc.

Moreover, when the activated voltage variation detection signal from the voltage variation detection circuit 131 is inputted in the order setting control circuit 126, it makes the order setting register 130 store "4" forcedly. That is, it makes the counter 128 perform the count operation forcedly during a period commensurate with TSEL4, and activates the control signal SEL4 during the period.

Figure 4:
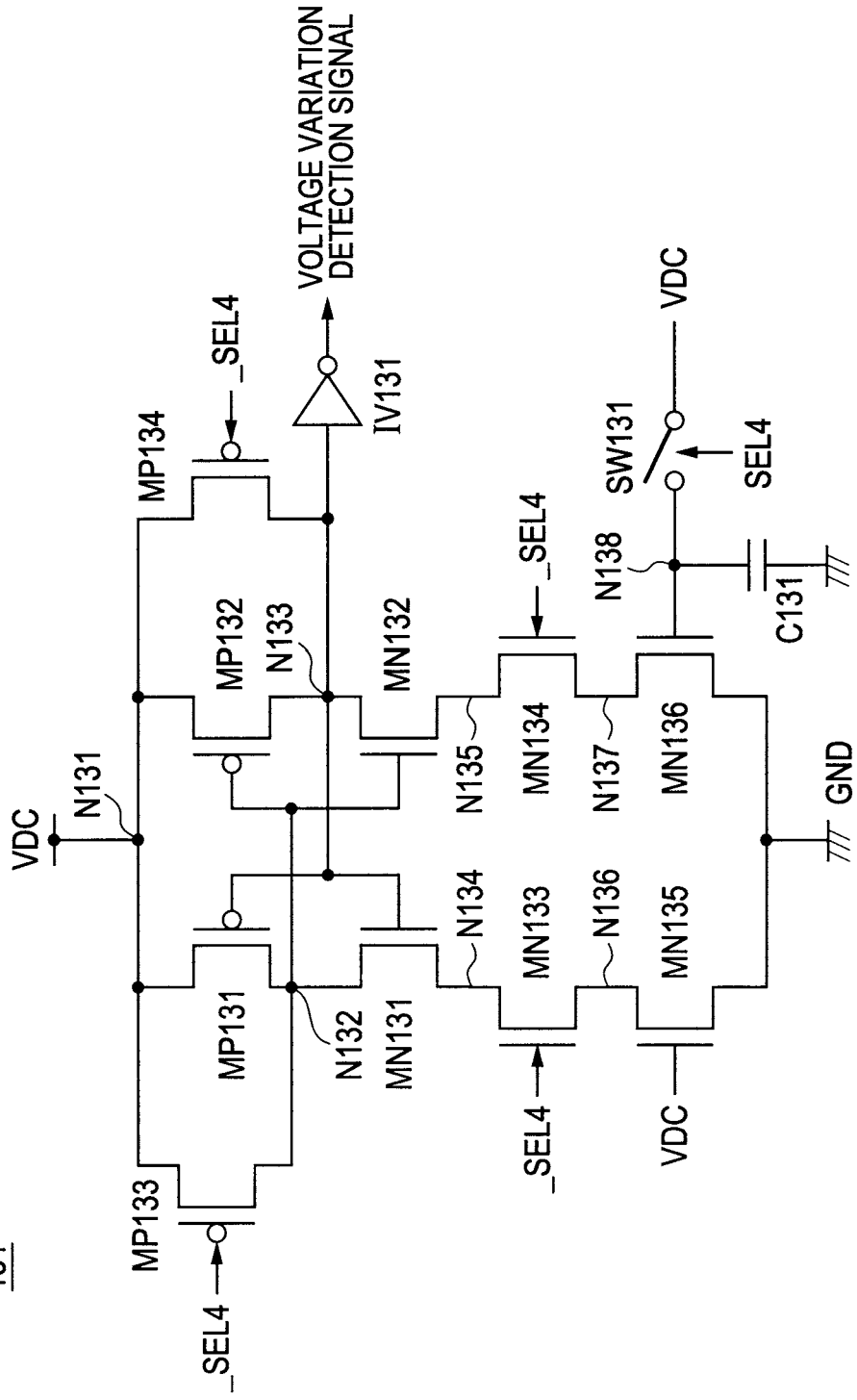
FIG. 4 is a configuration diagram of a voltage variation detection circuit according to the first embodiment.

The voltage variation detection circuit 131 detects a variation of the internal voltage VDC outputted from the voltage selection circuit 112, and outputs the voltage variation detection signal to the order setting control circuit 126. FIG. 4 shows a configuration of the voltage variation detection circuit 131. As shown in FIG. 4, the voltage variation detection circuit 131 has PMOS transistors MP131 to MP134, NMOS transistors MN131 to MN136, a capacitor C131, a switch SW131, and an inverter circuit IV131.

In the PMOS transistor MP131, its source is coupled to a node N131, its drain is coupled to a node N132, and its gate is coupled to a node N133. In a PMOS transistor MP133 is coupled in parallel with the MP131, and a control signal _SEL4 is inputted into its gate. In a PMOS transistor MP132, its source is coupled to the node N131, its drain is coupled to the node N133, and its gate is coupled to the node N132. The PMOS transistor MP134 is coupled in parallel with the MP132, and the control signal _SEL4 is inputted into its gate.

The internal voltage VDC is impressed on the node N131. However, the voltage impressed on the node N131 may be the power supply voltage VDD. The control signal _SEL4 is presumed to be an inverted signal of the control signal SEL4.

In the NMOS transistor MN131, its drain is coupled to the node N132, its source is coupled to a node N134, and its gate is coupled to the node N133. In the NMOS transistor MN133, its drain is coupled to the node N134, its source is coupled to a node N136, and the control signal _SEL4 is inputted into its gate. In the NMOS transistor MN135, its drain is coupled to the node N136, its source is coupled to the grounding terminal GND, and the internal voltage VDC is inputted into its gate. However, a voltage impressed on the gate may be the power supply voltage VDD. In the NMOS transistor MN132, its drain is coupled to the node N133, its source is coupled to a node N135, and its gate is coupled to the node N132. In the NMOS transistor MN134, its drain is coupled to the node N135, its source is coupled to the node N137, and the control signal _SEL4 is inputted into its gate. In the NMOS transistor MN136, its drain is coupled to a node N137, its source is coupled to the grounding terminal GND, and its gate is coupled to a node N138.

In the capacitor C131, one terminal thereof is coupled to the node N138 and the other terminal thereof is coupled to the grounding terminal GND. The switch circuit SW131 becomes in a conducting state in response to the activated control signal SEL4, and impresses the internal VDC on the node N138. An input terminal of the inverter circuit IV131 is coupled to the node N133.

Here, as is understood from the above-mentioned coupling, the PMOS transistors MP131, MP132 and the NMOS transistors MN131, MN132 make up the latch circuit. Incidentally, the nodes N132, N133 correspond to an input and an output of the latch circuit, respectively.

Moreover, the node N133 serves as an output node of the voltage variation detection circuit 131 through the inverter circuit IV131. That is, an inverted value of a voltage impressed on this node N133 becomes the voltage variation detection signal. Incidentally, in this first embodiment, it is assumed that when the voltage impressed on the node N133 is a high level, the voltage variation detection signal shall be in a deactivated state, and when it is low level, the voltage variation detection signal shall be in an activated state.

When the control signal SEL4 is activated, that is, when the control signal _SEL4 is low level, the PMOS transistor MP133 and the PMOS transistor MP134 become in an ON state. Therefore, the node N133 becomes in the high level and the voltage variation detection signal is fixed to low level. Moreover, the switch circuit SW131 becomes in a coupling state and the capacitor C131 is charged.

When the control signal SEL4 becomes a deactivated state (the control signal _SEL4 is the high level), the NMOS transistors MN133 and MN134 become in the ON state. In this state, when the internal voltage VDC that is a gate voltage of the NMOS transistor MN135 is lower than the node N138 that is a gate voltage of the NMOS transistor MN136, since a current driving capability of the NMOS transistor MN135 becomes lower than a current driving capability of the NMOS transistor MN136, the node N133 is reduced to be in the low level and the voltage variation detection signal becomes the high level.

Figure 5:
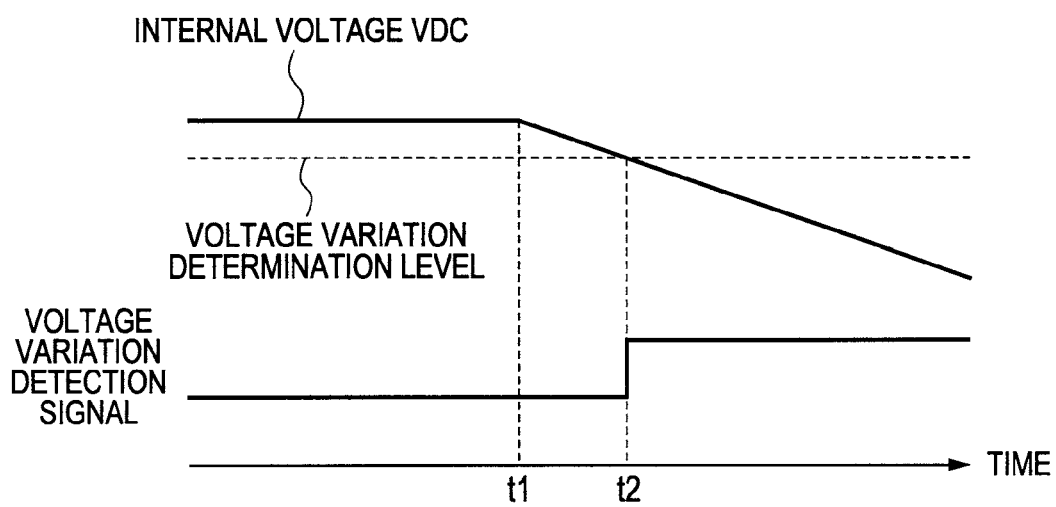
FIG. 5 is a timing chart explaining an operation of the voltage variation detection circuit according to the first embodiment.

Below, an operation of the voltage variation detection circuit 131 of FIG. 4 will be explained. FIG. 5 shows an operation waveform of the voltage variation detection circuit 131. As shown in FIG. 5, before time t1, the voltage variation detection signal has become low level. That is, in this state, the PMOS transistor MP131 and the NMOS transistor MN132 are in the ON state, and the PMOS transistor MP132 and the NMOS transistor MN131 have become in an OFF state. That is, the node N133 that is an output of the latch circuit composed of the PMOS transistors MP131, MP132 and the NMOS transistor MN131, MN132 is in the high level.

Here, when the power supply voltage VDD lowers at time t1, the internal voltage VDC also lowers accordingly. Therefore, when the internal voltage VDC lowers less than a voltage of the capacitor C131 charged at time t1, a potential of the node N133 lowers because of the above-mentioned explanation. Due to this drop of the potential of the node N133, the output of the latch circuit is inverted.

Therefore, the node N133 becomes in the low level at time t2, and the voltage variation detection signal becomes the high level. Thus, the voltage variation detection circuit 131 has a function of activating the voltage variation detection signal in response to a drop of the internal voltage VDC. That is, the time division control circuit 106 is equipped with a function of making the voltage selection circuit 102 select the internal voltage VD forcedly when the variation of the internal voltage VDC is detected.

Incidentally, time lags of times t1 to t2 are adjustable by setting up respective threshold voltages of the PMOS transistors MP131, MP132, and the NMOS transistors MN131, MN132, and the shorter these time lags, the more they are desirable.

Figure 6:
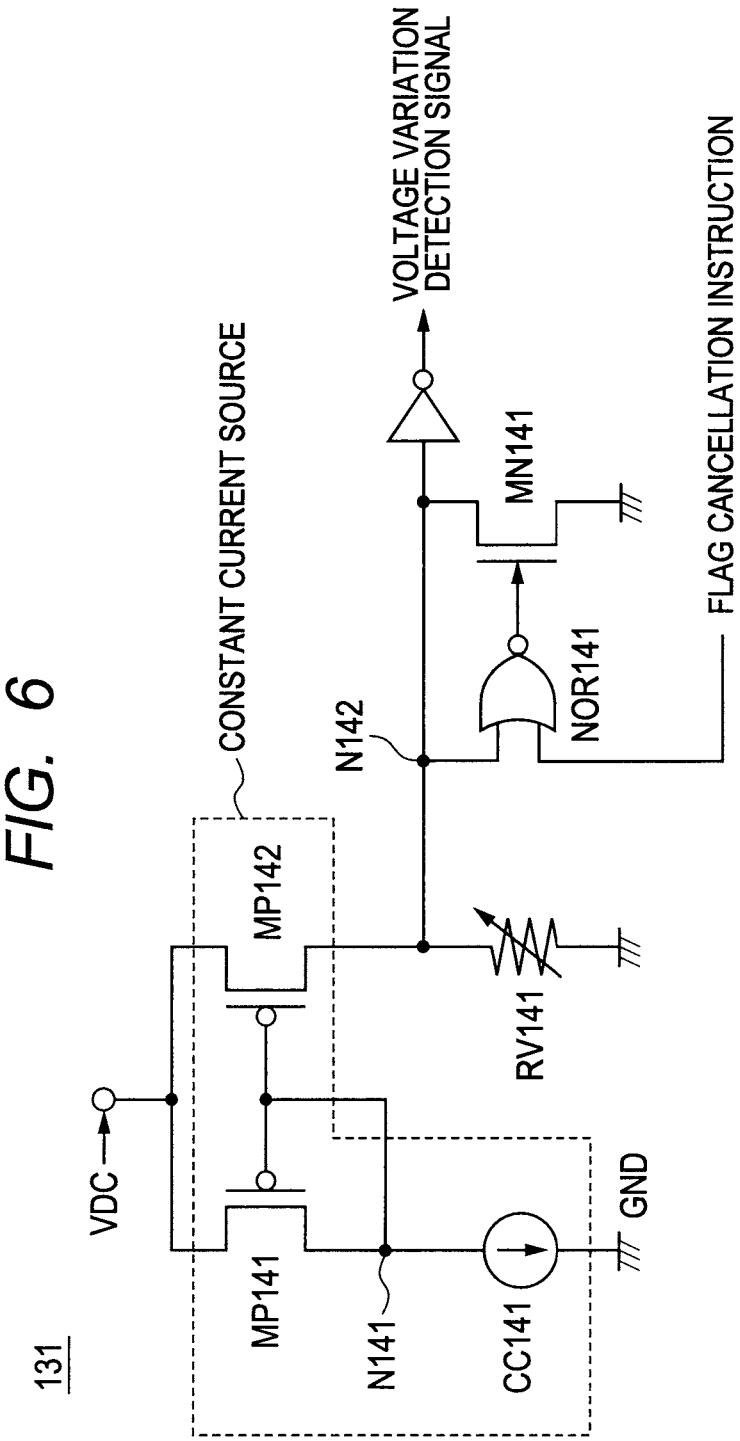
FIG. 6 is a configuration diagram of the voltage variation detection circuit according to the first embodiment.

Moreover, FIG. 6 shows an other configuration of the voltage variation detection circuit 131. As shown in FIG. 6, the voltage variation detection circuit 131 has PMOS transistors MP141, MP142, an NMOS transistor MN141, a constant current source CC141, a variable resistor RV141, a NOR circuit NOR141, an inverter circuit IV141, and a switch SW141.

In the PMOS transistor MP141, its source is coupled to a supply terminal of the internal voltage VDC, and its drain and gate are coupled to a node N141. In the PMOS transistor MP142, its source is coupled to the supply terminal of the internal voltage VDC, its drain is coupled to a node N142, and its gate is coupled to the node N141. Incidentally, the supply terminal of the internal voltage VDC may be replaced with the power supply terminal VDD.

The constant current source CC141 is coupled between the node N141 and the grounding terminal GND. In the variable resistor RV141, one of its terminals is coupled to the node N142 and the other thereof is coupled to the grounding terminal GND.

In the NOR circuit NOR141, one of its input terminals is coupled to the node N142. The other of the input terminals of the NOR circuit NOR141 is inputted a flag cancel instruction signal from the CPU (not illustrated) etc. An output terminal of the NOR circuit NOR141 is coupled to a gate of the NMOS transistor MN141. The flag cancel instruction signal is usually low level, and when the voltage variation detecting operation of the voltage variation detection circuit 131 is canceled, it becomes the high level.

In the NMOS transistor MN141, its drain is coupled to the node N142, its source is coupled to the grounding terminal GND, and its gate is coupled to the output terminal of the NOR circuit NOR141.

Below, the operation of the voltage variation detection circuit 131 of FIG. 6 will be explained. Incidentally, since an operation waveform becomes the same as that of FIG. 5, its explanation is omitted here.

First, the PMOS transistors MP141, MP142 make up a current mirror circuit in which the PMOS transistor MP141 serves as an input. Therefore, the PMOS transistor MP142 supplies a drain current commensurate with a current flowing in the PMOS transistor MP141 to the node N142. Here, the PMOS transistors MP141, MP142 and the constant current source CC141 can also be regarded as a single constant current source circuit. Incidentally, it is assumed that both of the PMOS transistors MP141, MP142 shall have the same transistor size ratio W/L.

There is the variable resistor RV141 of a resistance value of, for example, about 2 MΩ between the node N142 and the grounding terminal GND. Therefore, the level of the node N142 has usually become the high level.

However, when the internal voltage VDC lowers down to, for example, about 3 V, the PMOS transistor begins to turn off and a potential of the node N142 also lowers. When the potential of the node N142 lowers less than or equal to a low level input threshold of the NOR circuit NOR141, the NOR circuit NOR141 outputs the high level. Therefore, the NMOS transistor MN141 becomes in the ON state, and the potential of the node N142 lowers to the earth potential GND (low level). Then, the inverter circuit IV141 outputs the high-level voltage variation detection signal. A state of this voltage variation detection signal is maintained until the flag cancel instruction signal becomes the high level.

Incidentally, even when the internal voltage VDC or power supply voltage VDD lowers rapidly and becomes lower than or equal to the potential of the node N142, charge of the node N142 is extracted via the PMOS transistor. Therefore, when the potential of the node N142 lowers less than or equal to the low-level input threshold of the NOR circuit NOR141, the inverter circuit IV141 outputs the high-level voltage variation detection signal as with the above-mentioned explanation.

Incidentally, when the potential of the power supply voltage VDD rises and the voltage variation detecting operation of the voltage variation detection circuit 131 is canceled, the flag cancel instruction signal becomes the high level. In this case, the NOR circuit NOR141 outputs the low level and the NMOS transistor MN141 becomes in the OFF state. Therefore, the potential of the node N142 rises and the voltage variation detection signal that the inverter circuit IV141 outputs becomes low level again.

Incidentally, a pulse width of the voltage variation detection signal may be adjusted by coupling a capacitor of a predetermined capacitance between the node N142 and the grounding terminal GND.

Figure 7:
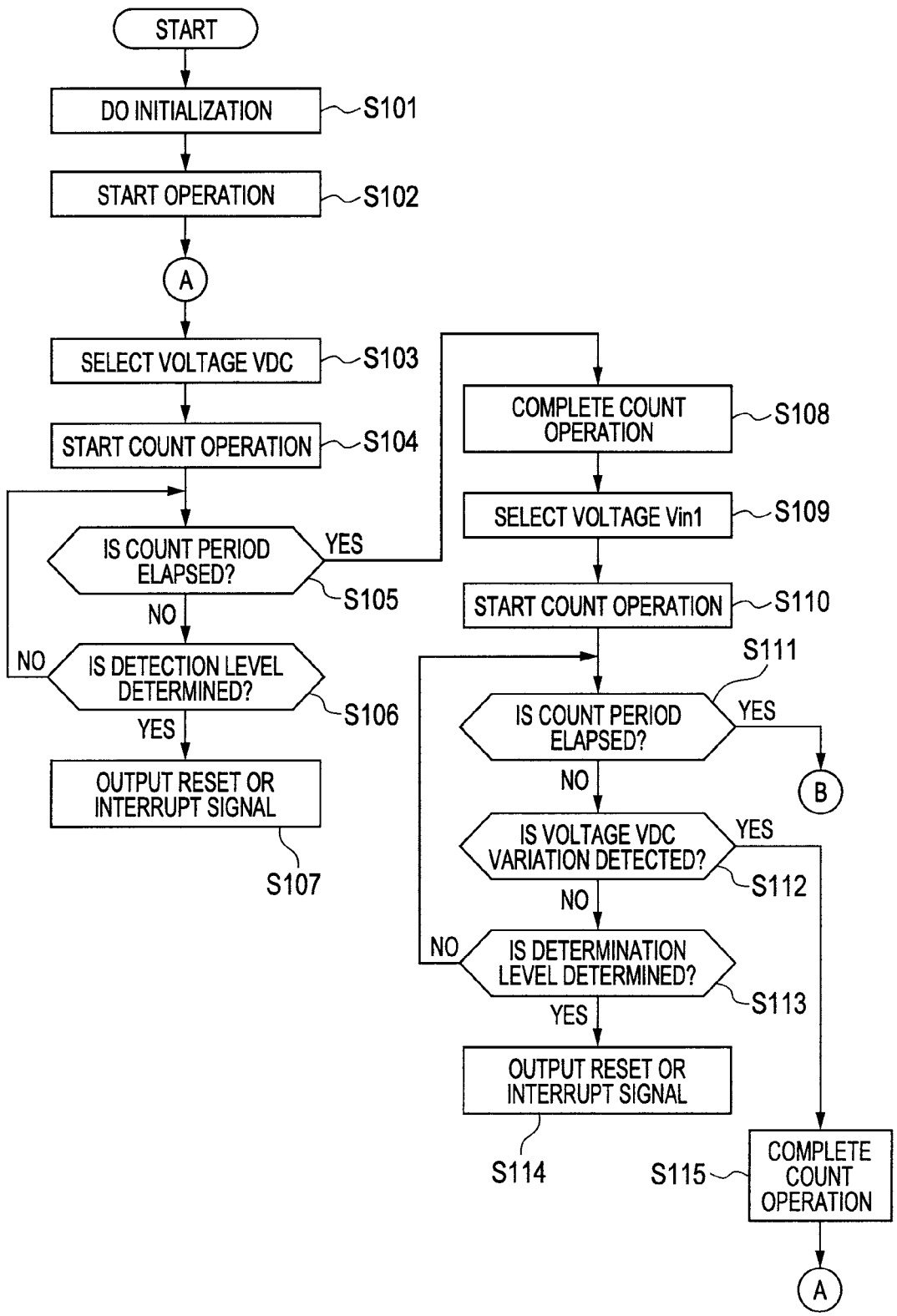
FIG. 7 is a flowchart explaining the operation of the voltage detection circuit according to the first embodiment.
Figure 8:
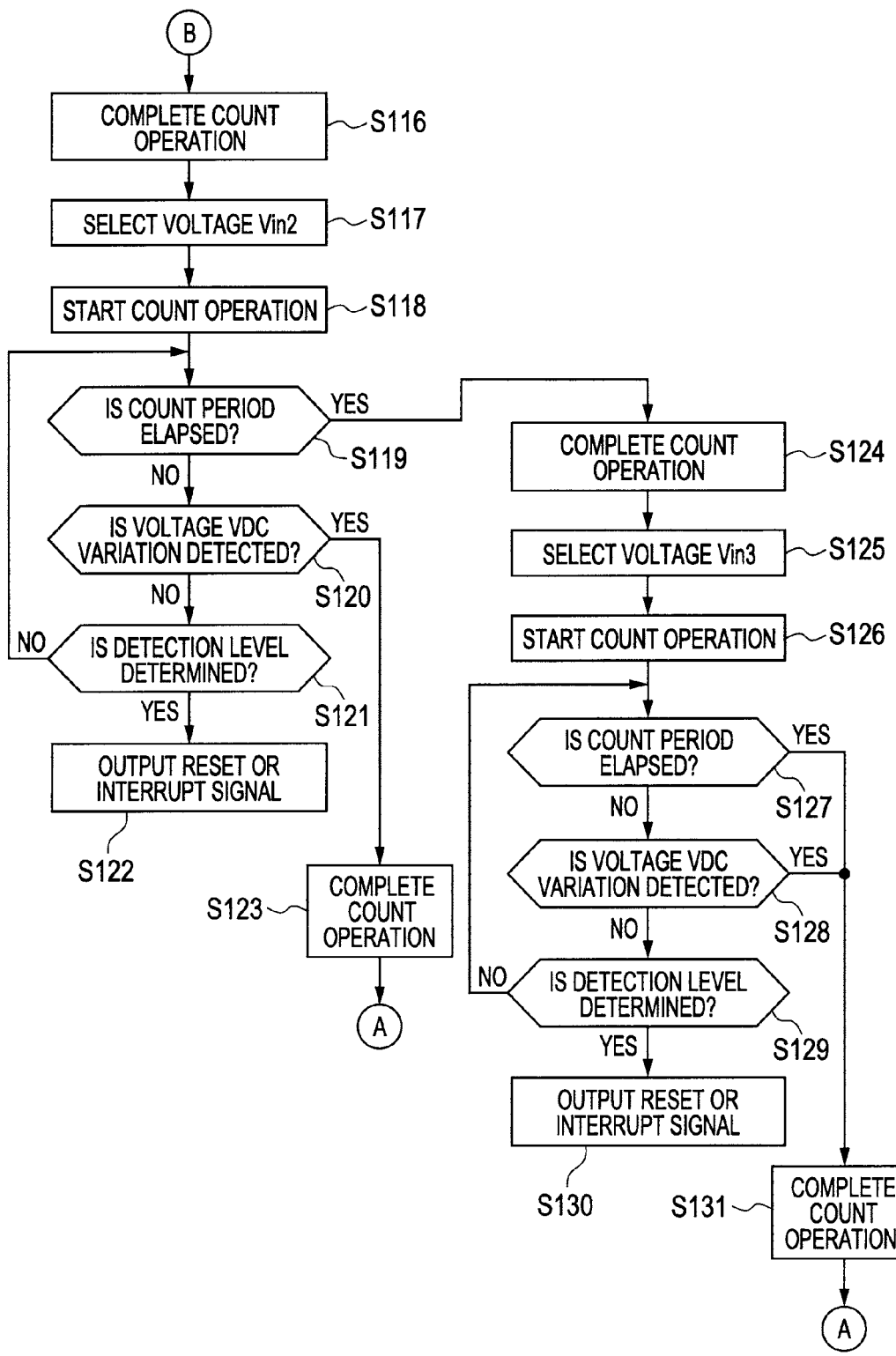
FIG. 8 is a flowchart explaining the operation of the voltage detection circuit according to the first embodiment.

Below, an operation of the voltage detection circuit 100 will be explained. FIG. 7 and FIG. 8 show a flowchart explaining the operation of the voltage detection circuit 100. As shown in FIG. 7 and FIG. 8, first, initialization is done (S101). In this initialization, a setup of register values of the time setting registers 121 to 124 etc. is performed. The set value is also set up to the register 113. Then, the voltage detection circuit 100 starts the operation on the conditions being set up at Step S101 (S102).

Next, the internal voltage VDC that is commensurate with the power supply voltage VDD is selected as the detection object (S103). That is, the value that the order setting register 130 stores is set to "4." Then, the counter 128 starts the count operation during a period commensurate with the register value TSEL4 (S104).

When, during this count period (NO at S105), the comparator 103 determines that the internal voltage VDC is lower than or equal to a detection level (the reference voltage VREF) (YES at S106), the reset signal or interrupt signal is outputted (S107).

On the other hand, when the count operation of the counter 128 elapsed the period commensurate with the register value TSEL4 (YES at S105), the count operation is completed (S108). Then, the external input voltage Vin1 is selected as the detection object (S109). That is, a value that the order setting register 130 stores is set to "1." Then, the counter 128 starts the count operation during a period commensurate with the register value TSEL1 (S110).

During this count period (NO at S111), when the internal voltage VDC commensurate with the power supply voltage VDD does not lower (NO at S112), if the comparator 103 determines that the external input voltage Vin1 is lower than or equal to the detection level (the reference voltage VREF) (YES at S113), the latch circuit 105 outputs the reset signal or interrupt signal (S114). During this count period (NO at S111), when the internal voltage VDC commensurate with the power supply voltage VDD lowers (YES at S112), the counter 128 completes the count operation and the flow shifts to Step S103.

On the other hand, when the count operation of the counter 128 elapsed the period commensurate with the register value TSEL1 (YES at S111), the counter 128 completes the counter operation (S116). Then, the external input voltage Vin2 is selected as the detection object (S117). That is, the value that the order setting register 130 stores is set to "2." Then, the counter 128 starts the count operation during a period commensurate with the register value TSEL2 (S118).

During this count period (NO at S119), when the internal voltage VDC commensurate with the power supply voltage VDD does not lower (NO at S120), if the comparator 103 determines that the external input voltage Vin2 is lower than or equal to the detection level (the reference voltage VREF) (YES at S121), the latch circuit 105 will output the reset signal or interrupt signal (S122). During this count period (NO at S119), when the internal voltage VDC commensurate with the power supply voltage VDD lowers (YES at S120), the counter 128 completes the count operation (S123) and the flow shifts to Step S103.

On the other hand, when the count operation of the counter 128 elapsed the period commensurate with the register value TSEL2 (YES at S119), the counter 128 completes the count operation (S124). Then, the external input voltage Vin3 is selected as the detection object (S125). That is, the value that the order setting register 130 stores is set to "3." Then, the counter 128 starts the count operation during a period commensurate with the register value TSEL3 (S126).

During this count period (NO at S127), when the internal voltage VDC commensurate with the power supply voltage VDD does not lower (NO at S128), if the comparator 103 determines that the external input voltage Vin3 is lower than or equal to the detection level (the reference voltage VREF) (YES at S129), the latch circuit 105 outputs the reset signal or interrupt signal (S130). During this count period (NO at S127), when the internal voltage VDC commensurate with the power supply voltage VDD lowers (YES at S128), or when this count period elapsed (YES at S127), the count operation is completed (S131) and the flow shifts to Step S103.

Figure 9:
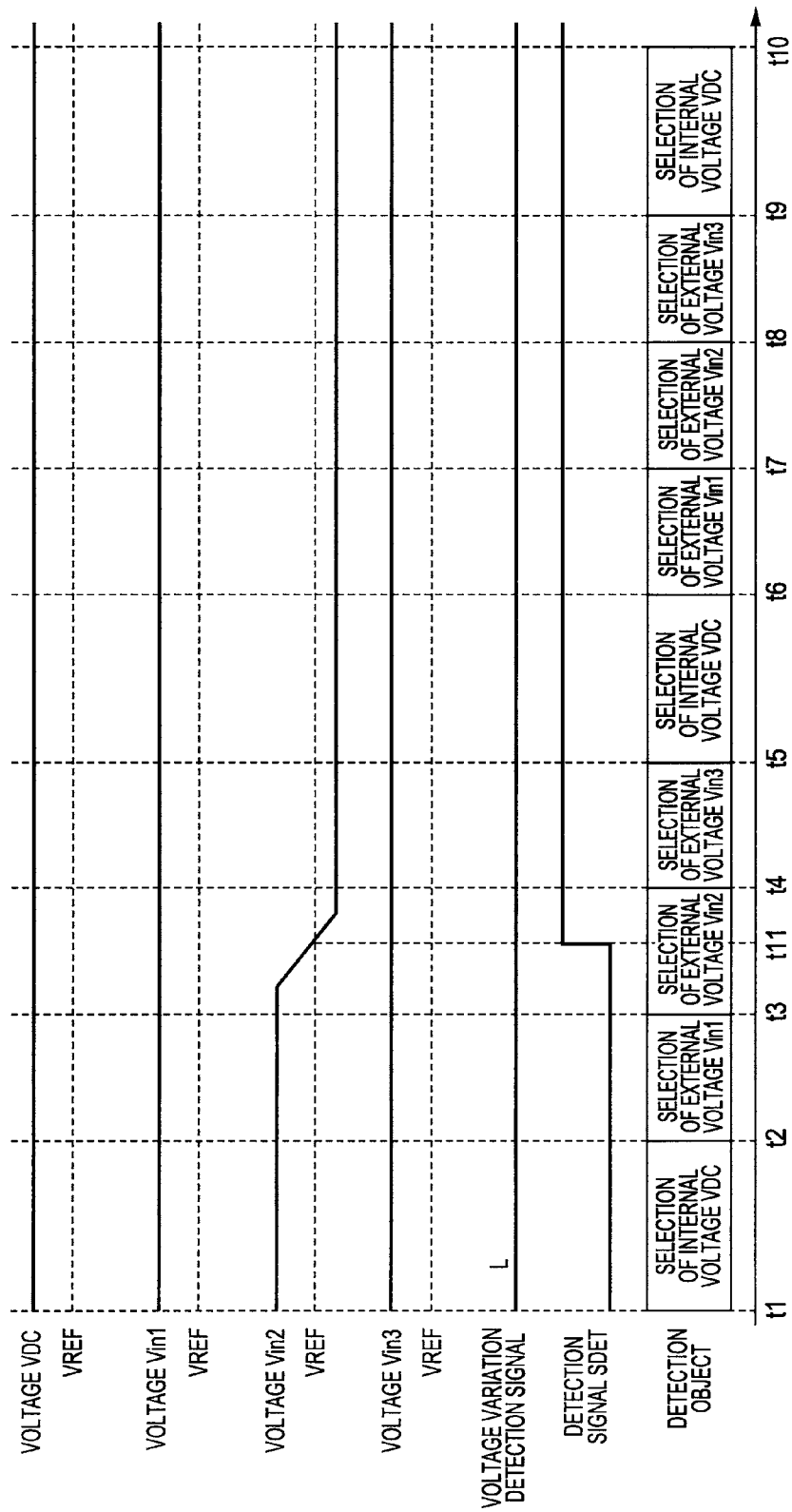
FIG. 9 is a timing chart explaining the operation of the voltage detection circuit according to the first embodiment.
Figure 10:
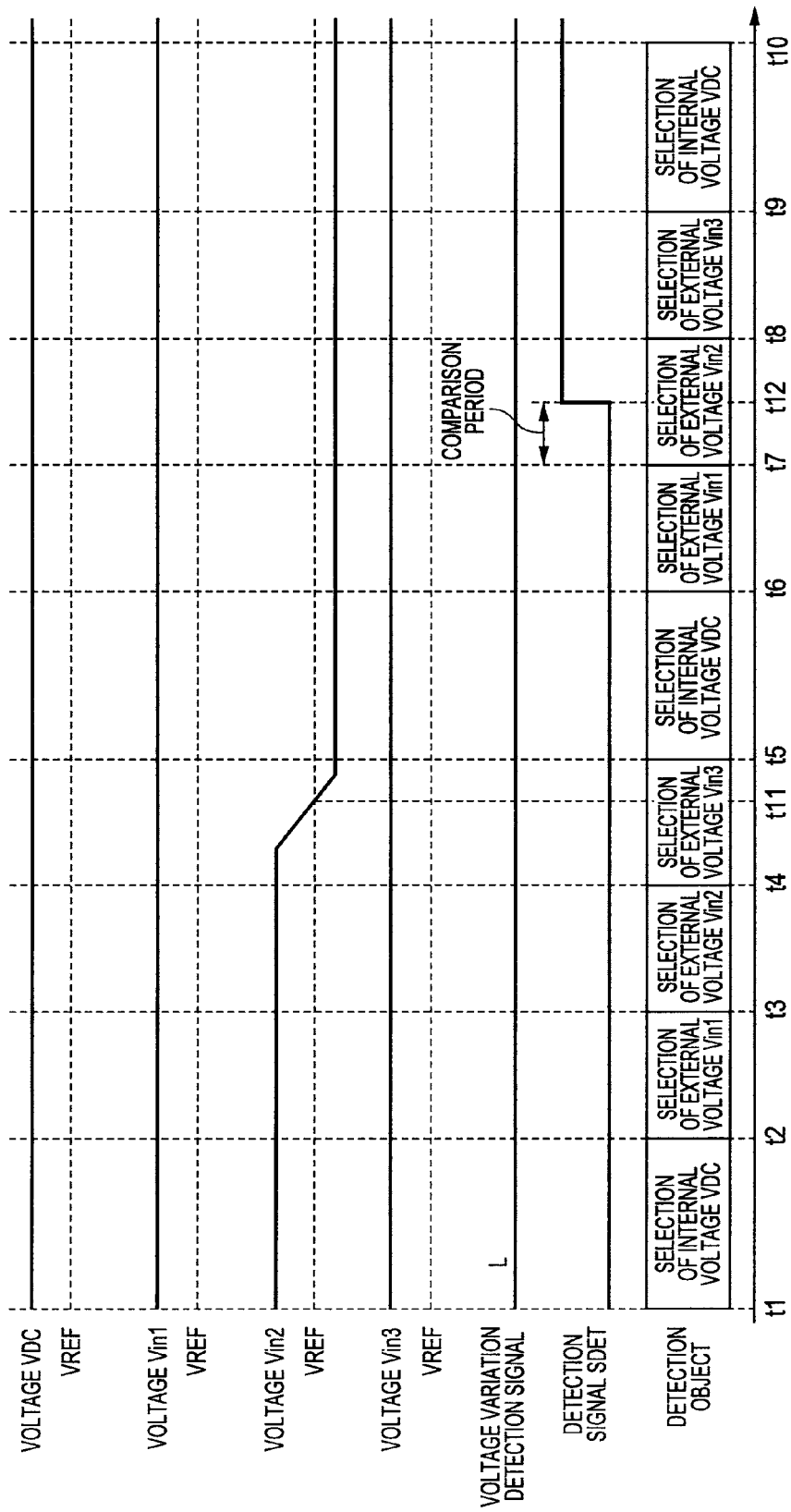
FIG. 10 is a timing chart explaining the operation of the voltage detection circuit according to the first embodiment.
Figure 11:
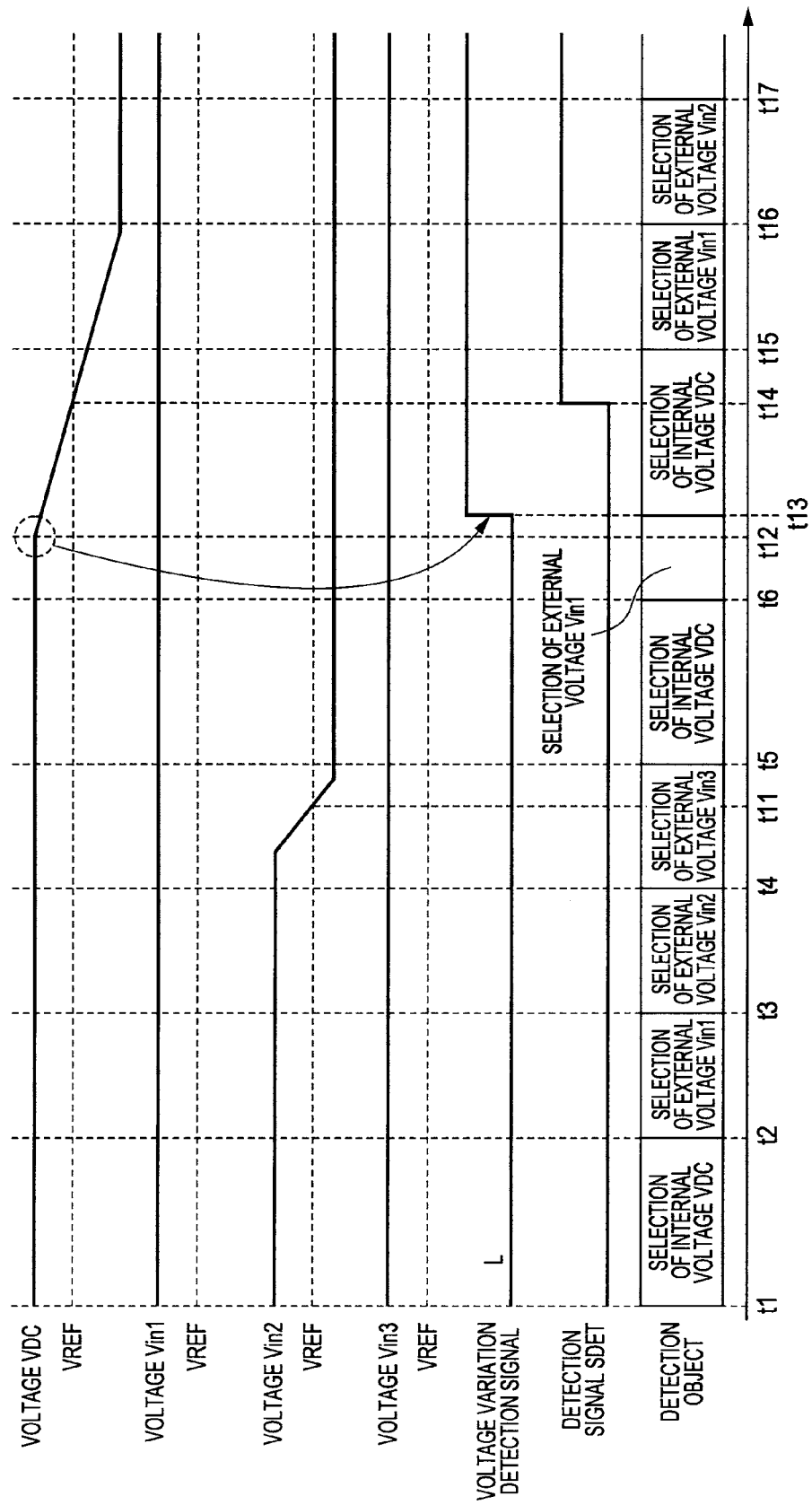
FIG. 11 is a timing chart explaining the operation of the voltage detection circuit according to the first embodiment.

FIG. 9 to FIG. 11 show an operation timing chart of the voltage detection circuit 100. In the timing charts of FIG. 9 and FIG. 10, the selected voltage VSEL that the detection voltage selection circuit 102 selects and outputs according to the control signals SEL1 to SEL4 from the time division control circuit 106 are switched sequentially to the internal voltage VDC, and the external input voltages Vin1, Vin2, and Vin3 at time t1, t2, t3, and t4. Therefore, the voltage that is compared with the reference voltage VREF by the comparator 103 is also switched. That is, the voltage that a voltage detection circuit 200 uses as the detection object is switched to the internal voltage VDC and the external input voltages Vin1, Vin2, and Vin3 sequentially at time t1, t2, t3, and t4, respectively. Incidentally, such switching is similarly performed at time t5, t6, t7, and t8, and is also repeated further at time t9 or later.

Here, a case where the external input voltage Vin2 lowers less than the reference voltage VREF at time t11 as shown in FIG. 9 will be explained. During a period of times t3 to t4, the control signal SEL2 from the time division control circuit 106 is being activated and the selected voltage VSEL has become Vin2. That is, the voltage that the voltage detection circuit 200 uses as the detection object is Vin2, and the comparator 103 compares the external input voltage Vin2 and the reference voltage VREF of a predetermined voltage value.

At time t11, the external input voltage Vin2 lowers less than the reference voltage VREF, and the high-level detection signal SDET is outputted from the comparator 103. Then, this high-level detection signal SDET makes the latch circuit 105 output the reset signal or interrupt signal.

Next, FIG. 10 shows a case where time t11 at which the external input voltage Vin2 lowers less than the reference voltage is not in a period where the detection object voltage is Vin2. In this case, at the point of time t11, the detection object voltage has become not the external input voltage Vin2 but Vin3, that is, the selected voltage VSEL has become Vin3. Therefore, at time t11, the high-level detection signal SDET is not outputted from the comparator 103.

After that, at time t7, the detection object voltage becomes the external input voltage Vin2 again. During this period of times t7 to t8, the selected voltage VSEL becomes Vin2, and the comparator 103 detects that Vin2 has lowered less than the reference voltage VREF. Then, after the comparison period, the high-level detection signal SDET is outputted from the comparator 103. This high-level detection signal SDET makes the latch circuit 105 output the reset signal or interrupt signal.

Next, FIG. 11 shows a case where the power supply voltage VDD lowers at time t12. Incidentally, since it is the same as that of the case of FIG. 10 before time t6, its explanation is omitted. As shown in FIG. 11, the power supply voltage VDD lowers at time t12, and the voltage VDC also lowers in connection with it. The voltage variation detection circuit 131 detects this drop of the voltage VDC, and changes a setup of the order setting register 130.

For example, just before time t12, the detection object voltage is the external input voltage Vin1, and the value that the order setting register 130 is storing is "1" (the value of the order setting signal is also "1"). Here, at time t12, the power supply voltage VDD lowers and the voltage variation detection signal is outputted from the voltage variation detection circuit 131. Then, the value of the order setting register 130 is rewritten to "4," and the value of the order setting signal is also set to "4."

As a result, the control signal SEL4 is activated and the selected voltage VSEL that the detection voltage selection circuit 102 outputs at time t13 switches from the external input voltage Vin1 to the internal voltage VDC. That is, the detection object voltage is changed from the external input voltage Vin1 to the internal voltage VDC.

Through this process, the comparator 103 compares the internal voltage VDC and the reference voltage VREF. Then, at time t14, the internal voltage VDC lowers less than the reference voltage VREF, and the comparator 103 outputs the high-level detection signal SDET. Then, by this detection signal SDET of the high level, the latch circuit 105 outputs the reset signal or interrupt signal.

Here, although the low voltage detector 1 of the related art shown in FIG. 19 was able to detect an internal power supply voltage drop, it was not able to detect a drop of the input voltage from the outside. The low voltage detection circuit 10 had a configuration whereby the external input voltage and the power supply voltage are changed by a switch circuit 12 as shown in FIG. 20. When this switch circuit 12 was selecting the external input voltage, the low voltage detection circuit 10 was able to detect the external input voltage drop with a comparator. However, during the period in which the switch circuit 12 was selecting the external input voltage, it was not able to detect the power supply voltage drop. Therefore, it was necessary to prepare a comparator for always monitoring the power supply voltage drop in addition to the comparator capable of detecting the external input voltage drop, which gave a problem of an increased circuit scale.

However, the voltage detection circuit 100 of this first embodiment uses a voltage commensurate with the external input voltage or the power supply voltage as the detection object voltage by time division. That is, time division is carried out to divide a time into a period that monitors the external input voltages, and a period that monitors a voltage commensurate with the power supply voltage, and voltages corresponding to respective periods are inputted into the comparator 103.

Furthermore, if the voltage detection circuit 100 detects that the power supply voltage lowers during a period of not monitoring the voltage commensurate with the power supply voltage, it changes forcedly the period to a period of monitoring the voltage commensurate with the power supply voltage, making sure detection of the power supply voltage drop. According to such a mechanism, the voltage detection circuit 100 of this first embodiment makes it possible to detect the power supply voltage drop with no exceptions and also makes it possible to reduce a circuit size because of not requiring multiple comparators.

Second Embodiment

Figure 12:
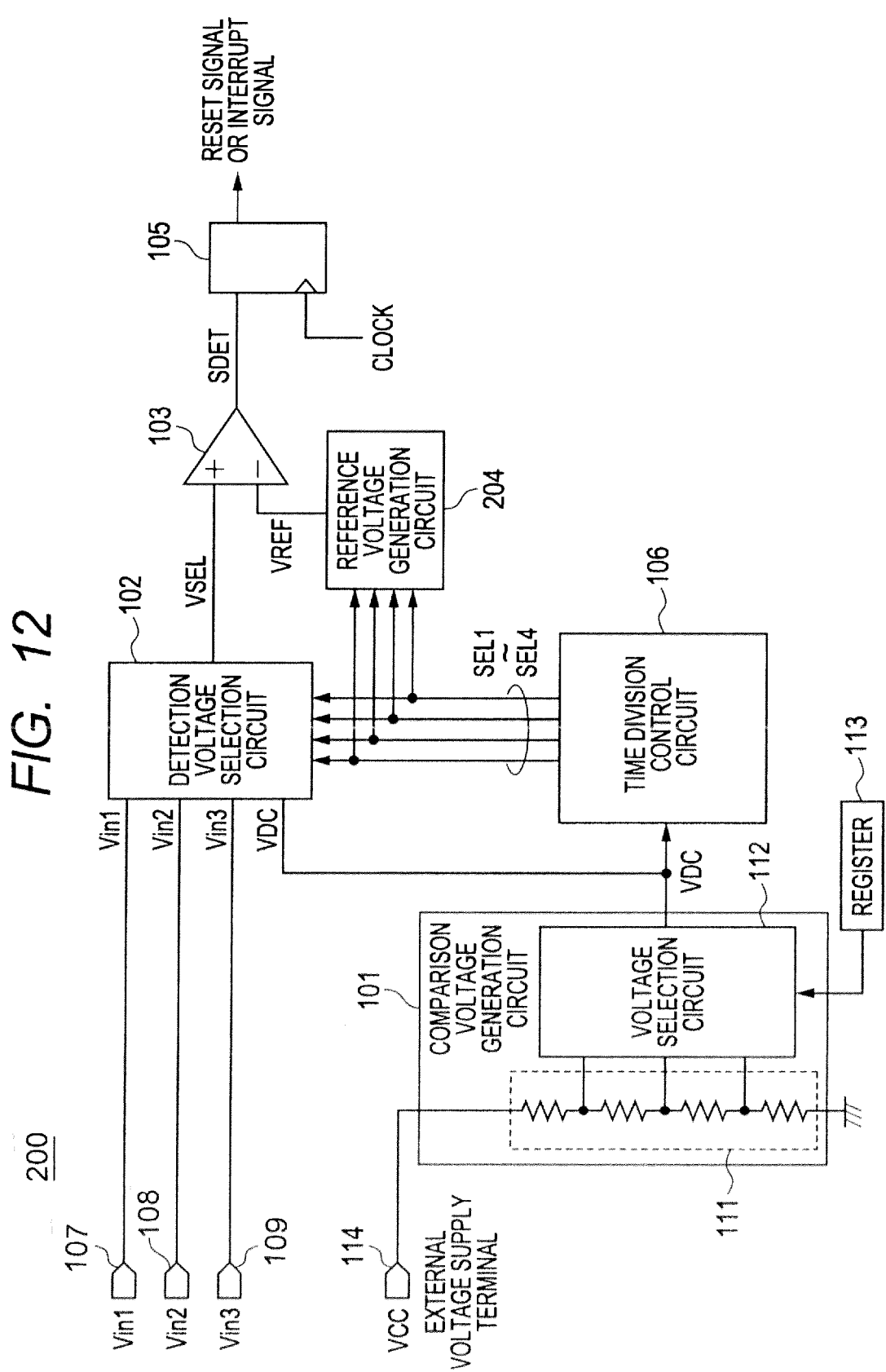
FIG. 12 is a block configuration of a voltage detection circuit according to a second embodiment.

Hereafter, a second concrete embodiment to which the present invention is applied will be explained in detail, referring to drawings. This second embodiment is one such that the present invention is applied to the voltage detection circuit of the microcontroller, like the first embodiment. FIG. 12 shows a block configuration of the voltage detection circuit 200 according to this second embodiment. As shown in FIG. 12, the voltage detection circuit 200 has the comparison voltage generation circuit 101, the detection voltage selection circuit 102, the comparator 103, a reference voltage generation circuit 204, the latch circuit 105, the time division control circuit 106, the external voltage input terminals 107 to 109, and the register 113.

Incidentally, any configuration given the same symbol as that of the FIG. 1 among symbols shown in FIG. 12 indicates the same or similar configuration as that of FIG. 1. What is different from the second embodiment is the reference voltage generation circuit 204. Therefore, the different portion will be explained emphatically here, with explanations of the same portions as those of the first embodiment being omitted.

The reference voltage generation circuit 204 varies a voltage value of the reference voltage VREF to be outputted according to the control signals SEL1 to SEL4.

Figure 13:
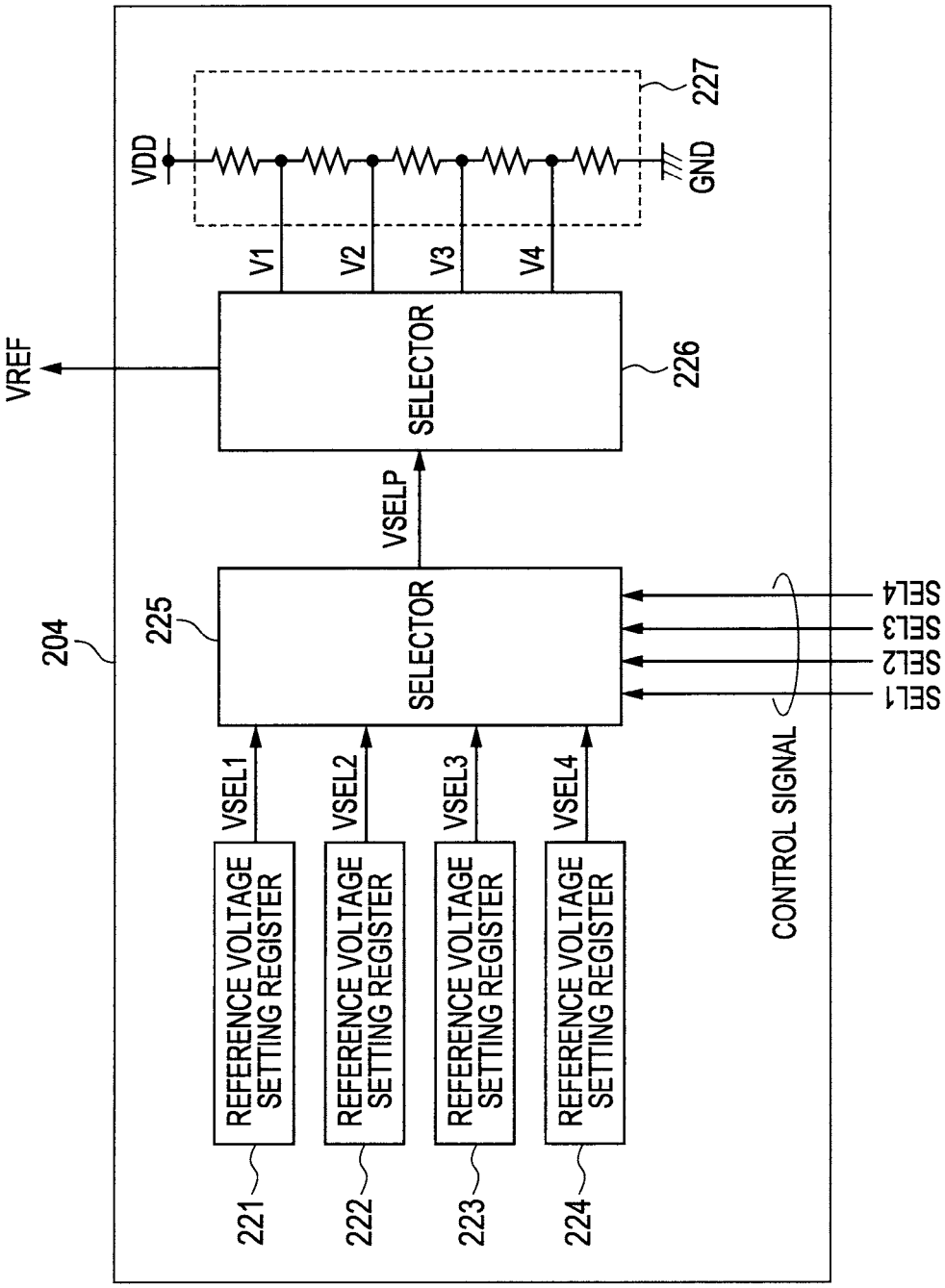
FIG. 13 is a block configuration of a reference voltage generation circuit according to the second embodiment.

FIG. 13 shows a configuration of the reference voltage generation circuit 204. As shown in FIG. 13, the reference voltage generation circuit 204 has reference voltage setting registers 221 to 224, selectors 225, 226, and a ladder resistor 227.

The reference voltage generation circuit 204 makes the reference voltage VREF variable depending on the voltage VSEL that the detection voltage selection circuit 102 outputs.

For example, when the detection voltage selection circuit 102 selects the external input voltage Vin1 as the voltage VSEL, the reference voltage VREF is set to a selection reference voltage V1. Similarly, when the detection voltage selection circuit 102 selects the external input voltage Vin2 or Vin3 as the voltage VSEL, the reference voltage VREF is set to a selection reference voltage V2 or V3, respectively. Moreover, when it selects the internal voltage VDC as the voltage VSEL, the reference voltage VREF is set to a selection reference voltage V4.

When the selected voltage VSEL is the external input voltages Vin1, Vin2, and Vin3 and the internal voltage VDC, the reference voltage setting registers 221 to 224 store respective set values each of which decides the voltage value of the reference voltage VREF outputted by the reference voltage generation circuit 204. The values that these reference voltage setting registers 201 to 204 store are designated by VSEL1 to VSEL4, respectively.

The selector 225 selects any one of the values VSEL1 to VSEL4 that the respective reference voltage setting registers 201 to 204 store according to the control signals SEL1 to SEL4, and outputs it as a selected signal VSELP. For example, when the control signal SEL1 is being activated, the selector 225 selects VSEL1 that the reference voltage setting register 201 is storing, and outputs it as the selected signal VSELP. Similarly in the following, when any one of the control signals SEL2 to SEL4 is being activated, the selector 225 selects any one of VSEL2 to VSEL4 according to the activated control signal, and outputs it as the selected signal VSELP.

The ladder resistor 227 has multiple resistors coupled in series between the power supply terminal VDD and the grounding terminal GND. At each coupling node between the resistors, the voltage obtained by dividing the power supply voltage VDD with the resistors is generated. For example, as shown in FIG. 13, the voltages of respective nodes are designated by V1 to V4.

The selector 226 selects one of the voltages that the ladder resistor 227 generated depending on a value of the selected signal VSELP, and outputs it as the reference voltage VREF. Incidentally, the reference voltage VREF that is selected and outputted by this selector 226 is called the above-mentioned selection reference voltage. That is, this selector 226 outputs any one of the selection reference voltages V1 to V4 as the reference voltage VREF.

For example, when the selected signal VSELP is VSEL1, the selection reference voltage V1 is selected by the selector 226 and is outputted as the reference voltage VREF. Below, similarly, when the selected signal VSELP is VSEL2, VSEL3, or VSEL4, one of the selection reference voltages V2, V3, and V4 is selected by the selector 226 and is outputted as the reference voltage VREF, respectively.

Incidentally, the above-mentioned explanation is a mere one example, and the voltages V1 to V4 do not necessarily need to correspond to VSEL1 to VSEL4, respectively. For example, consider a case where the reference voltage setting registers 201, 204 store the same value, and the selector 226 selects the selection reference voltage V1 for the value of these resisters. In this case, when the value of the selected signal VSELP becomes VSEL1 or VSEL4, the voltage V1 is selected by the selector 226 for both values. Thus, the voltage selected as the reference voltage VREF can be selected arbitrarily from the values that the ladder resistor 227 generates by values that the reference voltage setting registers 201 to 204 store.

Figure 14:
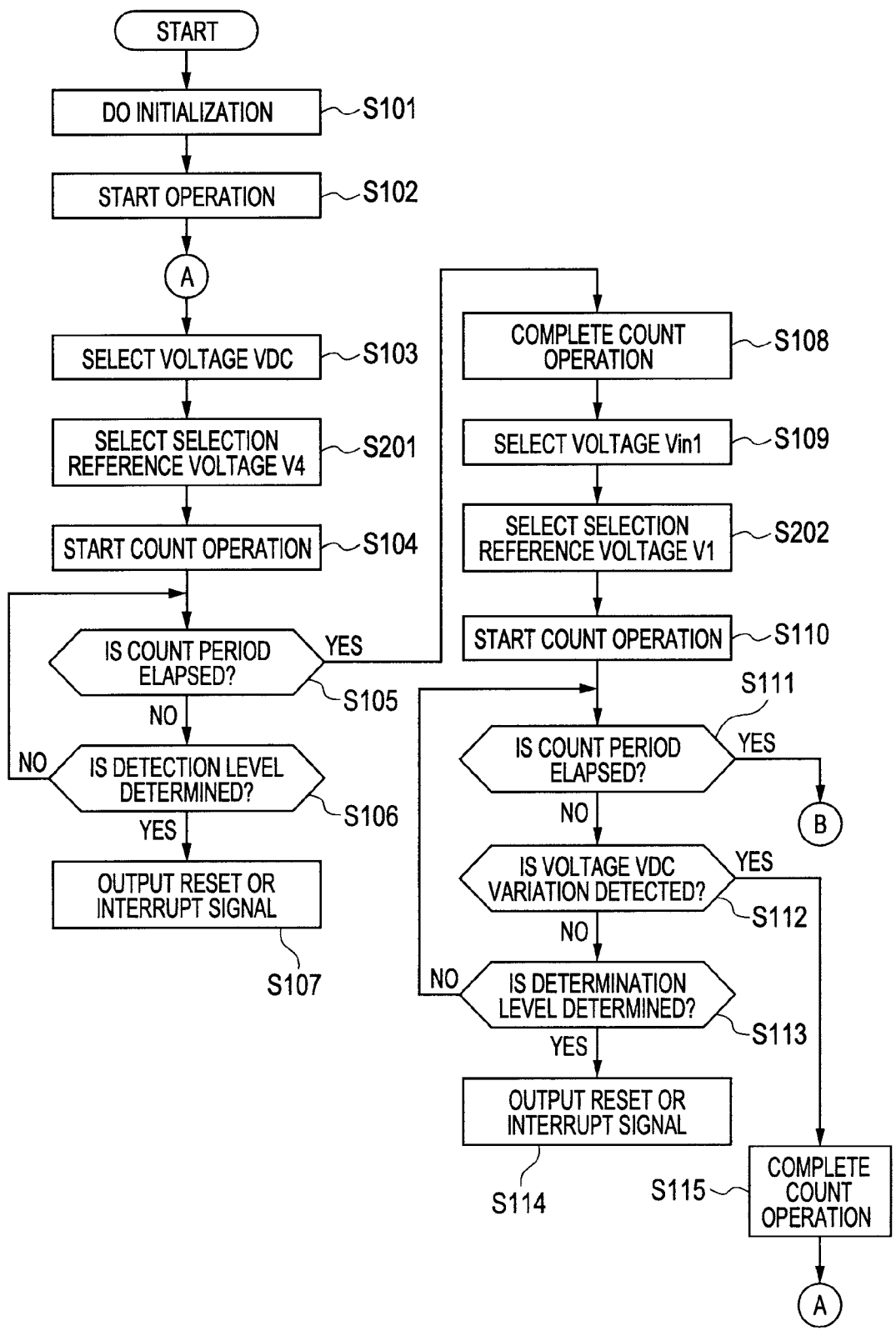
FIG. 14 is a flowchart explaining an operation of the voltage detection circuit according to the second embodiment.
Figure 15:
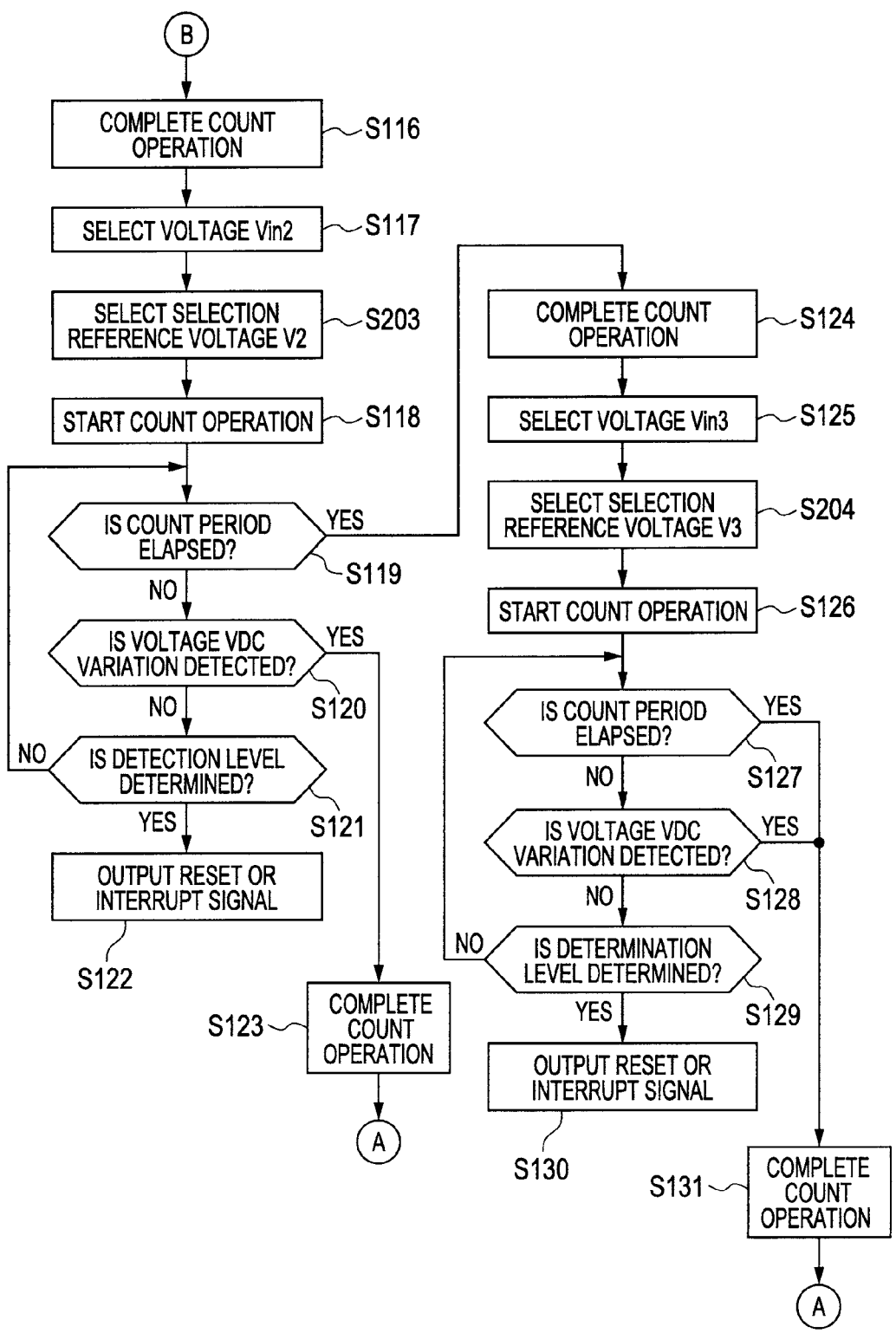
FIG. 15 is a flowchart explaining the operation of the voltage detection circuit according to the second embodiment.

Below, an operation of the voltage detection circuit 200 will be explained. FIG. 14 and FIG. 15 show a flowchart explaining the operation of the voltage detection circuit 200.

In this second embodiment, in the determination operation of the detection level, that the detection level is switched to one of the selection reference voltages V1 to V4, respectively, is different from the first embodiment but other respects of the second embodiment are the same as those of the first embodiment. Therefore, in FIG. 14 and FIG. 15, the same portions as those of the first embodiment shall be given the same symbols as in FIG. 7 and FIG. 8.

As shown in FIG. 14 and FIG. 15, first, initialization is performed (S101). In this initialization, the setup of the register values of the time setting registers 121 to 124 etc. is performed. Moreover, the set value is also set up to the register 113. Then, the operation is started on conditions being set up at Step S101 (S102).

Next, the internal voltage VDC commensurate with the power supply voltage VDD is selected for the detection object (S103). That is, a value that the order setting register 130 stores is set to "4." Next, the selection reference voltage V4 is selected as the reference voltage VREF (S201). That is, the value of the selected signal VSELP is set to VSEL4. Then, the counter 128 starts the count operation for the period commensurate with the register value TSEL4 (S104).

During this count period (NO at S105), if the comparator 103 determines that the internal voltage VDC is lower than or equal to the detection level (the selection reference voltage V4) (YES at S106), the latch circuit 105 will output the reset signal or interrupt signal (S107).

On the other hand, when the count operation of the counter 128 elapsed the period commensurate with the register value TSEL4 (YES at S105), the count operation is completed (S108). Then, the external input voltage Vin1 is selected as the detection object (S109). That is, the value that the order setting register 130 stores is set to "1." Next, the selection reference voltage V1 is selected as the reference voltage VREF (S202). That is, the value of the selected signal VSELP is set to VSEL1. Then, the counter 128 starts the count operation for the period commensurate with the register value TSEL1 (S110).

During this count period (NO at S111), when the internal voltage VDD commensurate with the power supply voltage VDD does not lower (NO at S112), if the comparator 103 determines that the external input voltage Vin1 is lower than or equal to the detection level (the selection reference voltage V1) (YES at S113), the latch circuit 105 will output the reset signal or interrupt signal (S114). During this count period (NO at S111), when the internal voltage VDC commensurate with the power supply voltage VDD lowers (YES at S112), the count operation is completed (S115) and the flow shifts to Step S103.

On the other hand, when the count operation of the counter 128 elapsed the period commensurate with the register value TSEL1 (YES at S111), the count operation is completed (S116). Then, the external input voltage Vin2 is selected as the detection object (S117). That is, the value that the order setting register 130 stores is set to "2." Next, the selection reference voltage V2 is selected as the reference voltage VREF (S203). That is, the value of the selected signal VSELP is set to VSEL2. Then, the counter 128 starts the count operation for the period commensurate with the register value TSEL2 (S118).

During this count period (NO at S119), when the internal voltage VDC commensurate with the power supply voltage VDD does not lower (NO at S120), if the comparator 103 determines that the external input voltage Vin2 is lower than or equal to the detection level (the selection reference voltage V2) (YES at S121), the latch circuit 105 will output the reset signal or interrupt signal (S122). During this count period (NO at S119), when the internal voltage VDC commensurate with the power supply voltage VDD lowers (YES at S120), the count operation is completed (S123) and the flow shifts to Step S103.

On the other hand, when the count operation of the counter 128 elapsed the period commensurate with the register value TSEL2 (YES at S119), the count operation is completed (S124). Then, the external input voltage Vin3 is selected as the detection object (S125). That is, the value that the order setting register 130 stores is set to "3." Next, the selection reference voltage V3 is selected as the reference voltage VREF (S204). That is, the value of the selected signal VSELP is set to VSEL3. Then, the counter 128 starts the count operation for the period commensurate with the register value TSEL3 (S126).

During this count period (NO at S127), when the internal voltage VDC commensurate with the power supply voltage VDD does not lower (NO at S128), if the comparator 103 determines that the external input voltage Vin3 is lower than or equal to the detection level (the selection reference voltage V3) (YES at S129), the latch circuit 105 will output the reset signal or interrupt signal (S130). During this count period (NO at S127), when the internal voltage VDC commensurate with the power supply voltage VDD lowers (YES at S128) or when this count period elapsed (YES at S127), the count operation is completed (S131) and the flow shifts to Step S103.

FIG. 16 to FIG. 18 show an operation timing chart of the voltage detection circuit 200. However, FIG. 16 to FIG. 18 shall be the same as FIG. 9 to FIG. 11 except that the reference voltage VREF is set to the voltages V1 to V4. That is, in this second embodiment, although the voltage that the voltage detection circuit 200 uses as the detection object switches sequentially to the internal voltage VDC and the external input voltage Vin1, Vin2, and Vin3 at times t1, t2, t3, and t4, simultaneously with it, the voltage value of the reference voltage VREF also switches to the selection reference voltages V4, V1, V2, and V3.

Here, as shown in FIG. 16, a case where the external input voltage Vin2 lowers less than the selection reference voltage V2 at time t11 will be explained. During a period of times t3 to t4, the control signal SEL2 from the time division control circuit 106 is being activated, the selected voltage VSEL has become Vin2, and the reference voltage VREF has become the selection reference voltage V2. That is, the comparator 103 performs the comparison with the selection reference voltage V2 by setting Vin2 as a voltage that the voltage detection circuit 200 uses as the detection object.

At time 11, the external input voltage Vin2 lowers less than the selection reference voltage V2, and the high-level detection signal SDET is outputted from the comparator 103. Then, by this high-level detection signal SDET, the reset signal or interrupt signal is outputted from the latch circuit 105.

Next, FIG. 17 shows a case where time t11 at which the external input voltage Vin2 lowers less than the selection reference voltage V2 is not in the period in which the detection object voltage is Vin2. In this case, at the point of time t11, the detection object voltage is not the external input voltage Vin2 but Vin3, that is, the selected voltage VSEL has becomes Vin3. Therefore, at time t11, the high-level detection signal SDET is not outputted from the comparator 103.

After that, at time t7, the detection object voltage becomes the external input voltage Vin2 again. During this period of times t7 to t8, the selected voltage VSEL becomes Vin2 and the comparator 103 detects that the external input voltage Vin2 lowers less than the selection reference voltage V2. Then, after the comparison period, the high-level detection signal SDET is outputted from the comparator 103. By this high-level detection signal SDET, the reset signal or interrupt signal is outputted from the latch circuit 105.

Next, FIG. 18 shows a case where the power supply voltage VDD lowers at time t12. Incidentally, since the case of FIG. 18 is the same as the case of FIG. 17 for time before time t6, its explanation is omitted. As shown in FIG. 18, the power Supply voltage VDD lowers at time t12, and the voltage VDC also lowers in connection with it. The voltage variation detection circuit 131 detects this drop of the voltage VDC, and changes the setup of the order setting register 130.

For example, just before time t12, the detection object voltage is the external input voltage Vin1 and the value that the order setting register 130 is storing is "1" (the value of the order setting signal is also "1"). Moreover, since the control signal that the control signal generation circuit 129 is activating is SEL1, the voltage that the reference voltage generation circuit 204 outputs as the reference voltage VREF is also the selection reference voltage V1.

Here, at time t12, the power supply voltage VDD lowers and the voltage variation detection signal is outputted from the voltage variation detection circuit 131. Then, the value of the order setting register 130 is rewritten by "4" and the value of the order setting signal also becomes "4."

As a result, the control signal SEL4 is activated and the selected voltage VSEL that the detection voltage selection circuit 102 outputs at time t13 changes from the external input voltage Vin1 to the internal voltage VDC. That is, the detection object voltage changes from the external input voltage Vin1 to the internal voltage VDC. Simultaneously, by the control signal SEL4 being activated, a voltage that the reference voltage generation circuit 204 outputs as the reference voltage VREF also changes from the selection reference voltage V1 to V4.

By this operation, the comparator 103 compares the internal voltage VDC and the selection reference voltage V4. Then, at time t14, the internal voltage VDC lowers less than the selection reference voltage V4, and the high-level detection signal SDET is outputted from the comparator 103. Then, by this high-level detection signal SDET, the reset signal or interrupt signal is outputted from the latch circuit 105.

As mentioned above, in the voltage detection circuit 200 of this second embodiment, it becomes possible to switch the reference voltage VREF inputted into one input terminal of the comparator 103 depending on the detection object voltage (Vin1 to Vin3, and VDC) inputted into the other input terminal thereof.

Here, in the first embodiment, the reference voltage VREF was constant. Therefore, accurate determination of the voltage drop for each detection object voltage that was switched by time division was difficult. However, in the voltage detection circuit 200 of this second embodiment, it becomes possible to flexibly change the value of the reference voltage VREF for each detection object voltage that was switched by time division depending on the values to be stored in the registers (the reference voltage setting registers 221 to 224). Therefore, a higher-accuracy low voltage determination becomes possible.

Note that the present invention is not limited to the above-mentioned embodiments, and can be suitably altered within a range that does not deviate from its purport.

What is claimed is:
1. A voltage detection circuit, comprising:
  a voltage selection circuit that outputs a voltage commensurate with a power supply voltage as a first voltage;
  a detection voltage selection circuit that selects either an external input voltage inputted from an external terminal or the first voltage according to a first control signal, and outputs it as a comparison voltage;

a reference voltage generation circuit that generates a reference voltage;

a comparator that compares the reference voltage and the comparison voltage, and outputs the comparison result as a detection signal; and a control circuit that generates the first control signal so that the detection voltage selection circuit may output either the first voltage or the external input voltage as the comparison voltage for adjustable selection periods, and when a variation of the first voltage or the power supply voltage is detected, generates the first control signal so that the detection voltage selection circuit outputs the first voltage as the comparison voltage.

2. The voltage detection circuit according to claim 1, wherein the control circuit has first and second registers, a first selector, a counter, and a control signal generation circuit, wherein the first register stores a first set value for specifying a first period in which the detection voltage selection circuit selects the first voltage, wherein the second register stores a second set value for specifying a second period in which the detection voltage selection circuit selects the external input voltage, wherein the first selector selects either the first or second set value depending on an order setting signal, wherein the counter counts the first or second period according to the first or second set value that the first selector selected, and wherein the control signal selection circuit generates the first control signal according to the order setting signal so that the detection voltage selection circuit selects the first voltage during the first period in which the counter counts, or generates the first control signal during the second period in which the counter counts so that the detection voltage selection circuit may select the external input voltage.

3. The voltage detection circuit according to claim 2, wherein the control circuit has a voltage variation detection circuit that outputs a voltage variation detection signal when a variation of the first voltage is detected, and wherein, when the voltage variation detection signal is outputted from the voltage variation detection circuit, the control circuit makes the first selector select the first set value by the order setting signal and generates the first control signal in the control signal generation circuit so that the detection voltage selection circuit selects the first voltage during the first period in which the counter counts.

4. The voltage detection circuit according to claim 3, wherein the voltage variation detection circuit has a latch circuit having first and second transistors of a first conductivity type and third, fourth, fifth, and sixth transistors of a second conductivity type, a capacitor, and first to fifth switch circuits, wherein the first and third transistors are coupled in series between a first node and a second node to which the first voltage or the power supply voltage is supplied, their intermediate node being coupled to a third node, and their control terminals being coupled to a fourth node, respectively, wherein the second and fourth transistors are coupled in series between the first node and a fifth node, their intermediate node being coupled to the fourth node, and their control terminals being coupled to the third node, respectively, wherein the first and second switch circuits establish a coupling between the first node and the third node and a coupling between the first node and the fourth node, respectively, in response to the first control signal during the first period, wherein the third and fourth switch circuits establish a coupling between the second node and a sixth node and a coupling between the fifth node and a seventh node, respectively, in response to the first control signal during the first period, wherein the fifth transistor is coupled between the sixth node and a grounding terminal, the first voltage or the power supply voltage being impressed on its control terminal, wherein the sixth transistor is coupled between the seventh node and the grounding terminal, the control terminal being coupled to an eighth node, wherein the capacitor is coupled between the eighth node and the grounding terminal, and wherein the fifth switch circuit supplies the first voltage or the power supply voltage to the eighth node in response to the first control signal in the second period.

5. The voltage detection circuit according to claim 3, wherein the voltage variation detection circuit has a constant current source, a resistor, a transistor, and a transistor control circuit, wherein the constant current source supplies a current commensurate with the first voltage or the power supply voltage to a first node, wherein the resistor is coupled between the first node and a grounding terminal, wherein the transistor is coupled between the first node and the grounding terminal, and wherein the transistor control circuit sets the transistor in an ON state when a potential of the first node lowers less than or equal to a predetermined threshold.

6. The voltage detection circuit according to any one of claim 1 to claim 5, wherein the voltage selection circuit has a first adder resistor, selects one from a plurality of divided voltage values of the power supply voltage generated by the first ladder resistor, and outputs it as the first voltage.

7. The voltage detection circuit according to claim 1, wherein the reference voltage generation circuit generates, in response to the first control signal, a reference voltage commensurate with the first voltage or the external input voltage.

8. The voltage detection circuit according to claim 7, wherein the reference voltage generation circuit has a second selector and a second ladder resistor, wherein the second ladder resistor divides the power supply voltage into a plurality of voltages as a plurality of selection reference voltages, and wherein the second selector selects one from the selection reference voltages according to the first control signal, and outputs it as the reference voltage.

9. The voltage detection circuit according to claim 8, wherein the reference voltage generation circuit further has third and fourth registers, wherein the third and fourth registers store a third set value for specifying the selection reference voltage commensurate with the external input voltage and a fourth set value for specifying the selection reference voltage commensurate with the first voltage, respectively, and wherein the second selector selects one from the selection reference voltages based on the third and fourth set values among the selection reference voltages according to the first control signal, and outputs it as the reference voltage.

10. A method for controlling a voltage detection circuit that includes:
- a voltage selection circuit for outputting a voltage commensurate with a power supply voltage as a first voltage, a detection voltage selection circuit that selects either an external input voltage inputted from an external terminal or the first voltage, and outputs it as a comparison voltage;
- a reference voltage generation circuit for generating a reference voltage; and
- a comparator that compares the reference voltage and the comparison voltage, and outputs the comparison result as a detection signal, the method comprising:
- making the detection voltage selection circuit output either the first voltage or the external input voltage as the comparison voltage for adjustable selection periods, and
- when a variation of the first voltage is detected, making the detection voltage selection circuit select the first voltage and output it as the comparison voltage even when the detection voltage selection circuit is selecting the external input voltage.

11. The method for controlling a voltage detection circuit according to claim 10, the voltage detection circuit having first and second registers and a counter,
the method further comprising:
- making the first register store a first set value for specifying a first period in which the detection voltage selection circuit selects the first voltage;
- making the second register store a second set value for specifying a second period in which the detection voltage selection circuit selects the external input voltage;
- selecting the first or second set value;
- making the counter count the first or second period depending on the selected set value;
- making the detection voltage selection circuit select the first voltage during the first period in which the counter counts; and
- making the detection voltage selection circuit select the second voltage during the second period in which the counter counts.

12. The method for controlling a voltage detection circuit according to claim 11, the voltage detection circuit further including a voltage variation detection circuit that detects a variation of the first voltage,
the method further comprising:
- when the voltage variation detection circuit detects the variation of the first voltage, selecting the first set value forcedly and making the detection voltage selection circuit select the first voltage during the first period in which the counter counts even during the second period in which the counter counts.

13. The method for controlling a voltage detection circuit according to any one of claim 10 to claim 12, the voltage selection circuit having a first ladder resistor,
the method further comprising:
- making the voltage selection circuit select at least one of a plurality of divided voltage values of the power supply voltage that are generated by the first ladder resistor and output it as the first voltage.

14. The method for controlling a voltage detection circuit according to claim 10,
the method further comprising:
- making the reference voltage generation circuit generate a reference voltage commensurate with either the first voltage or the external input voltage.

15. The method for controlling a voltage detection circuit according to claim 14, the reference voltage generation circuit having a second ladder resistor for dividing the power supply voltage into a plurality of selection reference voltages,
the method further comprising:
- making the reference voltage generation circuit select one from the selection reference voltages and output it as the reference voltage.

16. The method for controlling a voltage detection circuit according to claim 15, the reference voltage generation circuit further having third and fourth registers,
the method further comprising:
- making the third and fourth registers store a third set value for specifying the selection reference voltage commensurate with the external input voltage and a second set value for specifying the selection reference voltage commensurate with the first voltage, respectively; and
- selecting one from the selection reference voltages that are based on the third set value or the fourth set value among the selection reference voltages and outputting it as the reference voltage.

\* \* \* \* \*